United States Patent [19]

Sato et al.

[11] Patent Number: 4,870,289
[45] Date of Patent: Sep. 26, 1989

[54] APPARATUS FOR CONTROLLING RELATION IN POSITION BETWEEN A PHOTOMASK AND A WAFER

[75] Inventors: Takeo Sato; Shinichiro Aoki, both of Kawasaki; Katsumasa Yamaguchi, Sagamihara; Tadashi Kaneko, Sagamihara; Noboru Nomura, Kyoto; Keisuke Koga, Osaka; Kazuhiro Yamashita, Amagasaki, all of Japan

[73] Assignee: Matsushita Electric Industrial Co., Ltd., Osaka, Japan

[21] Appl. No.: 248,051

[22] Filed: Sep. 23, 1988

[30] Foreign Application Priority Data

Sep. 25, 1987 [JP] Japan ................. 62-241234
Sep. 25, 1987 [JP] Japan ................. 62-241230
Sep. 25, 1987 [JP] Japan ................. 62-241232
Sep. 25, 1987 [JP] Japan ................. 62-241235

[51] Int. Cl.$^4$ .................... G01V 9/04; G01B 11/00
[52] U.S. Cl. .................... 250/548; 356/400
[58] Field of Search .......... 250/202, 225, 226, 548, 250/557, 561, 571; 356/399-401

[56] References Cited

U.S. PATENT DOCUMENTS

| | | | |
|---|---|---|---|
| 3,541,338 | 11/1970 | Duda et al. | 250/548 |
| 3,867,038 | 2/1975 | Westell | 356/400 |
| 4,631,416 | 12/1986 | Trutna, Jr. | 356/400 |
| 4,664,524 | 5/1987 | Hattori et al. | 356/400 |
| 4,780,616 | 10/1988 | Nishi et al. | 250/548 |

Primary Examiner—David C. Nelms
Assistant Examiner—Stephone B. Allen
Attorney, Agent, or Firm—Pollock, VandeSande & Priddy

[57] ABSTRACT

A system for controlling the relation in position between a photomask and a wafer for use in manufacturing apparatus of a highly integrated circuit such as large scale integration (LSI). The position control system includes a coherent light source for generating two light beams which are different in frequency and polarizing direction from each other. The light beams from the coherent light source is introduced into a first diffraction grating and the diffracted light from the first diffraction grating selectively pass through a telecentric lens system and are led to second and third diffraction gratings respectively disposed on the photomask and the wafer. Light beat signals are obtained in correspondance with the diffracted light from the second and third diffraction gratings and the position relation between the photomask and wafer is controlled on the basis of the phase difference between the obtained light beat signals which corresponds to the position difference between the photomask and the wafer.

24 Claims, 12 Drawing Sheets

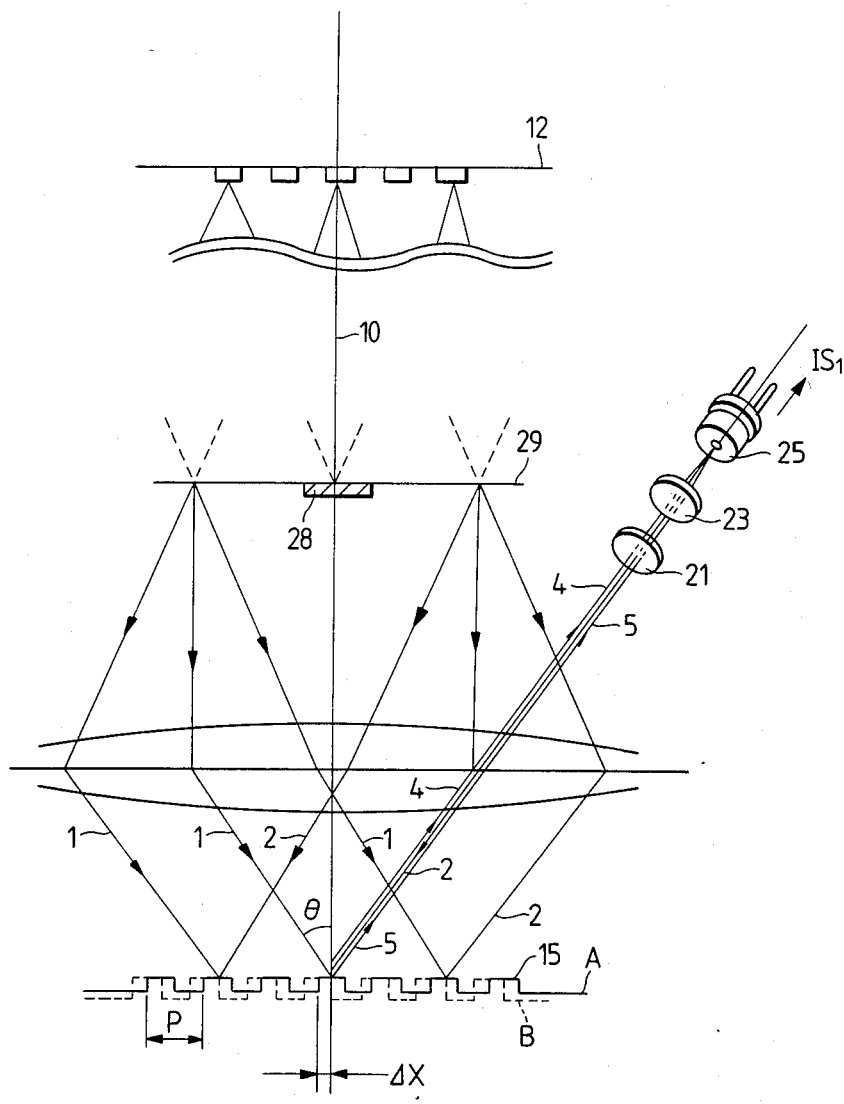

APPARATUS FOR CONTROLLING RELATION IN POSITION BETWEEN A PHOTOMASK AND A WAFER

BACKGROUND OF THE INVENTION

The present invention relates generally to an optical positioning apparatus, and more particularly to such an apparatus for accurately controlling the relation in position between a photomask of an exposure device and a wafer which is used to integrally form on its surface a microscopic circuit such as large scale integration (LSI).

For formation of a microscopic circuit on a semiconductor base, i.e., wafer, a selected pattern is transferred from a photomask to a surface of a wafer by means of the exposure technique. An important problem in the microscopic pattern transferring art relates to a highly accurate positioning of the photomask with respect to the wafer. For example, the positioning accuracy therebetween on manufacturing of an LSI may be required to be below 0.03 micrometers. One known positioning technique is made such that an alignment mark provided on a wafer is coincident with a reference mark of a photomask by moving a wafer-supporting stage in directions normal to the exposure optical axis with respect to the photomask. However, this conventional positioning techinique is insufficient for the formation of a microscopic circuit such as LSI because the positioning accuracy is about 0.3 micrometers. One possible solution for the formation of submicroscopic circuits may be to use the double diffraction positioning method and optical heterodyne interference positioning method such as are disclosed in "Applied Physics Letters", Vol. 31, No. 7, 1977 and Japanese Patent Provisional Publication No. 62-58628, the brief descriptions thereof will be made hereinafter. However, these techiniques have a tendency to result in deterioration of the positioning accuracy and therefore a further improvement would be required from the viewpoint of prevention of the deterioration of the positioning accuracy.

SUMMARY OF THE INVENTION

The present invention has been developed in order to remove the drawbacks inherent to the prior art positioning techniques.

It is therefore on object of the present invention to provide a position control apparatus which is capable of stably performing the positioning of a photomask of an exposure device with respect to a wafer with an extremely high accuracy.

A basic feature of the present invention is that the position control system includes a coherent light source for generating two light beams which are different in frequency and polarizing direction from each other and the light beams from the coherent light source is introduced into a first diffraction grating and the diffracted light from the first diffraction grating selectively pass through a telecentric lens system and are led to second and third diffraction gratings respectively disposed on a photomask and a wafer, light beat signals being obtained in correspondance with the diffracted light from the second and third diffraction gratings so that the position relation between the photomask and wafer is controlled on the basis of the phase difference between the obtained light beat signals which corresponds to the position difference between the photomask and the wafer.

In accordance with the present invention, there is provided a position control system for controlling the relative relation in position between first and second position-controlled objects which are disposed in parallel to each other so as to form a predetermined gap therebetween and adapted to be movable relatively with respect to each other, comprising: coherent light source means for generating two-wavelength light whose frequencies are slightly different from each other and whose polarizing directions are different from each other; first diffraction grating means disposed in of an optical path of the two-wavelength light generated from said coherent light source; optical system means disposed in an optical path of the diffracted light from said first diffraction grating means for selectively transmitting the diffracted light therefrom; second and third diffraction grating means disposed in an optical path of the light passed through said optical system means, said second diffraction grating means being placed on said first position-controlled object and said third diffraction grating means being placed on said second position-controlled object; detecting means disposed in an optical path of the diffracted light from said second and third diffraction grating means for generating light beat signals corresponding to the diffracted light therefrom; phase comparison means for making a comparison between said light beat signals from said detecting means to generate a position-difference signal corresponding to the result of the comparison; and position control means coupled to said phase comparison means for controlling the relative position between said first and second position-controlled objects on the basis of the position-difference signal generated from said phase comparison means.

More specifically, said optical system means has a numerical aperture for allowing transmission of 0 order, +1 order and −1 order diffracted light from said first diffraction grating means, has therein a spectrum surface at positions of luminescent spots of the 0 order, +1 order and −1 order diffracted light therefrom and further a spece filter for cutting off one of the 0 order, +1 order and −1 order diffracted light therefrom, and is formed so that one surface facing said second and third diffraction grating means is telecentric. Furthermore, said optical system means has therein a ½ wave plate at the vicinity of said spectrum surface which is used for at least either of the +1 order or −1 order diffracted light.

In accordance with the present invention, there is further provided a position control system for controlling the relative relation in position between first and second position-controlled objects which are disposed in parallel to each other so as to form a predetermined gap therebetween and adapted to be movable relatively with respect to each other, comprising: coherent light source means for similtanously generating two light beams whose frequencies are slightly different from each other and whose polarizing directions are different from each other; first diffraction grating means disposed in an optical path of the two-wavelength light generated from said coherent light source; optical system means disposed in a optical path of the diffracted light from said first diffraction grating means for selectively transmitting the diffracted light therefrom; second and third diffraction grating means disposed in an optical path of the light passed through said optical system means, said second diffraction grating means being placed on said first position-controlled object and said third diffraction grating means being placed on said second position-controlled object; light combination means for respectively picking up groups of two wavelength diffracted light from said second and third diffraction grating means each group of which are coincident in direction with each other and different in frequency from each other and for respectively combining each group of the two wavelength diffracted light; detecting means for detecting light beat signals corresponddding to the respective combined diffracted light; phase comparison means for making a comparison between said light beat signals from said detecting means to generate a position-difference signal corresponding to the result of the comparison; and position control means coupled to said phase comparison means for controlling the relative position between said first and second position-controlled objects on the basis of the position-difference signal generated from said phase comparison means.

More specifically, said light combination means comprises a first combiner means for respectively taking out the group of the two wavelength diffracted light from said second diffraction grating means which are coincidnet in direction with each other and slightly different in frequency from each other and for optically combining the group of the diffracted light with each other and a second combiner for taking out the group of two wavelength diffracted light from said third diffraction grating means the group of which are coincident in direction with each other and slightly different in frequency from each other and for optically combining the group of the diffracted light with each other, and said detecting means comprises a first detector for detecting a first light beat signal corresponding to the combined diffracted light made by said first combiner of the light combination means and a second detector and a second detector for detecting a second light beat signal corresponding to the combined diffracted light made by said second combiner thereof. Furthermore, said optical system means selects, of the diffracted light from said first diffraction grating means, the 0 order diffracted light and either of the +1 order or −1 order diffracted light and each of said first and second light beat signals is due to a combination of either of the +1 order or −1 order diffracted light and either of the +2 order or −2 order diffracted light from said second and third diffraction grating means.

As another arrangement, said light combination means comprises first and second light combiners for selectively taking out two groups of two-wavelength diffracted light from said second diffraction grating means, the two diffracted light of each of the two groups being are coincident in direction with each other and slightly different in frequency from each other and for optically combining respectively the selectively taken-out two groups of the two-wavelength diffracted light and a third light combiner for taking out a group of two-wavelength diffracted light from said third diffraction grating means which are coincident in direction with each other and slightly different in frequency from each other and for optically combining the taken-out group of the two-wavelength diffracted light, and said detecting means comprises first and second detectors for respectively detecting first and second light beat signals corresponding to the combined diffracted light due to said first and, second light combiners and a third detectors for detecting a third light beat signal corresponding to the combined diffracted light due to said third light combiner, and said phase comparison means performs the phase comparison among said first to third light beat signals from said first to third detectors of said detecting means and said position control means controls the relative position between said first and second position-controlled objects on the basis of the position-difference signals therefrom so that the phase difference between said first and third light beat signals becomes zero and so that the phase difference between the first and second light beat signals becomes zero.

As a further arrangement, said light combination means comprises a first light combiner for taking out a group of two-wavelength diffracted light from said second diffraction grating which are coincident in direction with each other and slightly different in frequency from each other and for optically combining the taken-out diffracted light and second and third light combiners for selectively taking out two groups of two-wavelength diffracted light from said third diffraction grating means, the two diffracted light of each of two groups being coincident in direction with each other and slightly different in frequency from each other and for optically combining respectively the selectively taken-out two groups of the two-wavelength diffracted light, and said detecting means comprises a first detector for detecting a first light beat signal corresponding to the combined diffracted light by said first detector and second and third detectors for respectively detecting second and third light beat signals corresponding to the combined diffracted light due to s id second and third light combiners, and said phase comparison means performs the phase comparison among said first to third light beat signals from said first to third detectors of said detecting means and said position control means controls the relative position between said first and second position-controlled objects on the basis of the position-difference signals therefrom so that the phase difference between said first and second light beat signals becomes zero and so that the phase difference between the second and third light beat signals becomes zero.

As a still further arrangement, said light combination means comprises first and second light combiners for selectively taking out two groups of two-wavelength diffracted light from said second diffraction grating each of which are coincident in direction with each other and slightly different in frequency from each other and for optically combining each of the groups of the taken-out diffracted light and third and fourth light combiners for selectively taking out two groups of two-wavelength diffracted light from said third diffraction grating means each of two groups of which are coincident in direction with each other and slightly different in frequency from each other and for optically combining respectively the selectively taken-out two groups of the two-wavelength diffracted light, and said detecting means comprises first and second detectors for detecting first and second light beat signals corresponding to the respective combined diffracted light by said first and second and third and fourth detectors for respectively detecting third and fourth light beat signals corresponding to the respective combined diffracted light due to said third and fourth light combiners, and said phase comparison means performs the phase comparison among s id first to fourth light beat signals from said first to fourth detectors of said detecting means and said position control means controls the relative position between said first and second position-controlled objects on the basis of the position-difference signals therefrom so that the phase difference between said first and third light beat signals becomes zero and so that the phase difference between the second and fourth light beat signals becomes zero.

Preferably, the position control system includes at least one light-intensity attenuation means which is provided in the optical path of the diffracted light from said first diffraction grating means.

BRIEF DESCRIPTION OF THE DRAWINGS

The object and features of the present invention will become more readily apparent from the following detailed description of the preferred embodiments taken in conjunction with the accompanying drawings in which:

FIG. 10 is an illustration for describing the principal of the positioning between the photomask and the wafer;

DETAILED DESCRIPTION OF THE INVENTION

Prior to describing the embodiments of the present invention, the prior art techniques will briefly be described with reference to FIGS. 1 and 2 for a better understanding of the present invention, FIG. 1 being an illustration for decribing the principal of the double diffraction positioning method and FIG. 2 being an optical arrangement diagram for describing the positioning method based upon a combination of the double diffraction technique and optical heterodyne interference techinique.

Figure 1:
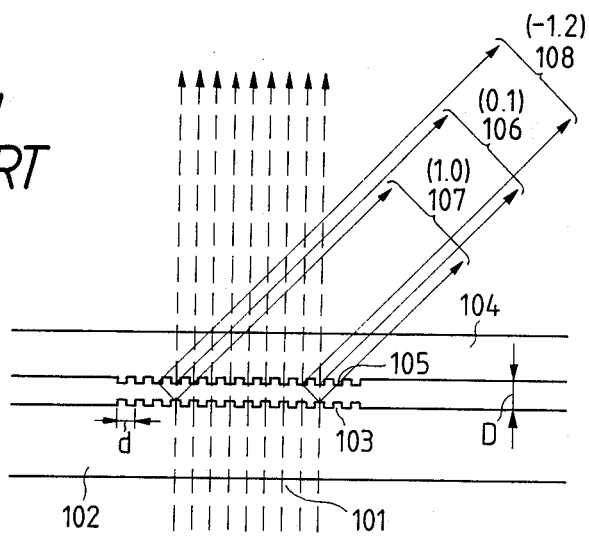
FIG. 1 is an illustration for describing the principal of the prior art double diffraction method.

In FIG. 1, a laser beam illustrated by reference numeral 101 is incident upon a photomask 102 and diffracted by a diffraction grating 103 (pitch interval: d) disposed on the photomask 102. The diffracted light beam is again diffracted by another diffraction grating 105 formed on a wafer 104 so as to obtain double-diffracted light beams 106 to 108. If expressing the double-diffracted light beams 106 to 108 with two values, i.e, the diffraction order at the photomask 102 and the diffraction order at the wafer 104, the diffracted light beam 106 is (0, 1), the diffracted light beam 107 is (1, 0) and the diffracted light beam 108 is (−1, 2). With these diffracted light beams 106 to 108 are combined with each other by means of a lens system (not shown), the intensity of interference light is detected by means of an appropriate photodetector. In addition, interference light similarly appears symmetrically in the right and left directions with respect to the incident laser beam 101 and the symmetrical interference light are detected by means of two photodetectors disposed to be symmetrical each other. The positioning between the photomask 102 and the wafer 104 is made such that the difference between the light intensities detected by the two symmetrically disposed photodetectors becomes zero. In this case, the positioning accuracy is about 400 to 600 angstroms.

Figure 2:
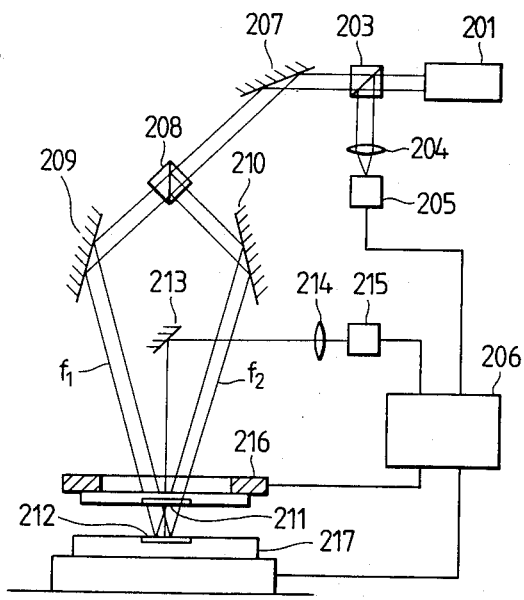
FIG. 2 is an optical arrangement diagram for describing the prior art positioning method based upon a combination of the double diffraction technique and the optical heterodyne interference technique.

On the other hand, in FIG. 2, a portion of light beam emitted from a two-wavelength linear polarization laser source 201 is separated and taken out through a beam splitter 203. After passed through a condenser lens 204, the taken-out light beam is detected by a photodetector 205 which in turn supplies as a reference beat signal the output signal to a signal processing control unit 206. Whereas, the other portion of the light beam emitted from the two-wavelength linear polarization laser source 201 is introduced from the beam splitter 203 through a mirror 207 into a polarization beam splitter 208. The polarization beam splitter 208 divides the introduced light beam into two light beams which are linear polarized light beams each having only the horizontal component or vertical component and slightly different in wavelength from each other. Thereafter, the divided light beams are respectively transmitted through mirrors 209 and 210 to a transmission-type diffraction grating 211 and a reflection-type diffraction grating 212. The diffracted light from the transmission-type diffraction grating 211 and the reflection-type diffraction grating 212 is toward a mirror 213 and a condenser lens 214 and reaches a photodetector 215 which in turn supplies as a diffraction light beat signal the output signal to the signal processing control unit 206. The signal processing control unit 206 detects the phase difference between the reference beat signal and the diffraction light beat signal and, for positioning, controls the relative movements of a mask stage 216 and a wafer stage 217 so that the phase difference becomes zero.

However, in the case of the former (double diffraction method), the interval, i.e., gap, D between the photomask 102 and the wafer 104 is determined so as to be the integer times of $d^2/\lambda$ where d is the diffraction grating pitch and λ is the wavelength, and the setting accuracy and maintaining accuracy of the interval D provide the strong influence to the light intensity on a photodetector (not shown). In order words, the positioning signal strongly depends upon the interval D. Furthermore, since the diffraction light other than (1. 0), (0, 1), (−2, 1) additionally appears on the unshown photodetector, the S/N of the positioning signal is deteriorated so as to make difficult its practical use. On the other hand, in the case of the latter (the combination of the double diffraction method and optical heterodyne interference method), since the divided two-wavelength light beams f1 and f2 slightly different in frequency from each other are incident through the mirrors 209, 210 thereupon from the two specific directions, it is possible to take out desirable diffraction light to stably obtain the beat signal, thereby resulting in excellent S/N. However, because the divided two-wavelength light beams f1 and f2 different in frequency from each other pass through two different optical paths, a phase difference due to variation factors (for example, fluctuation in the optical paths) is added to the phase difference caused by the alignment error between the photomask 211 and the wafer 212, thereby resulting in easy deterioration of the positioning accuracy of the photomask 211 with respect to the wafer 212 and, similarly, in difficulty of the practical use.

Figure 3:
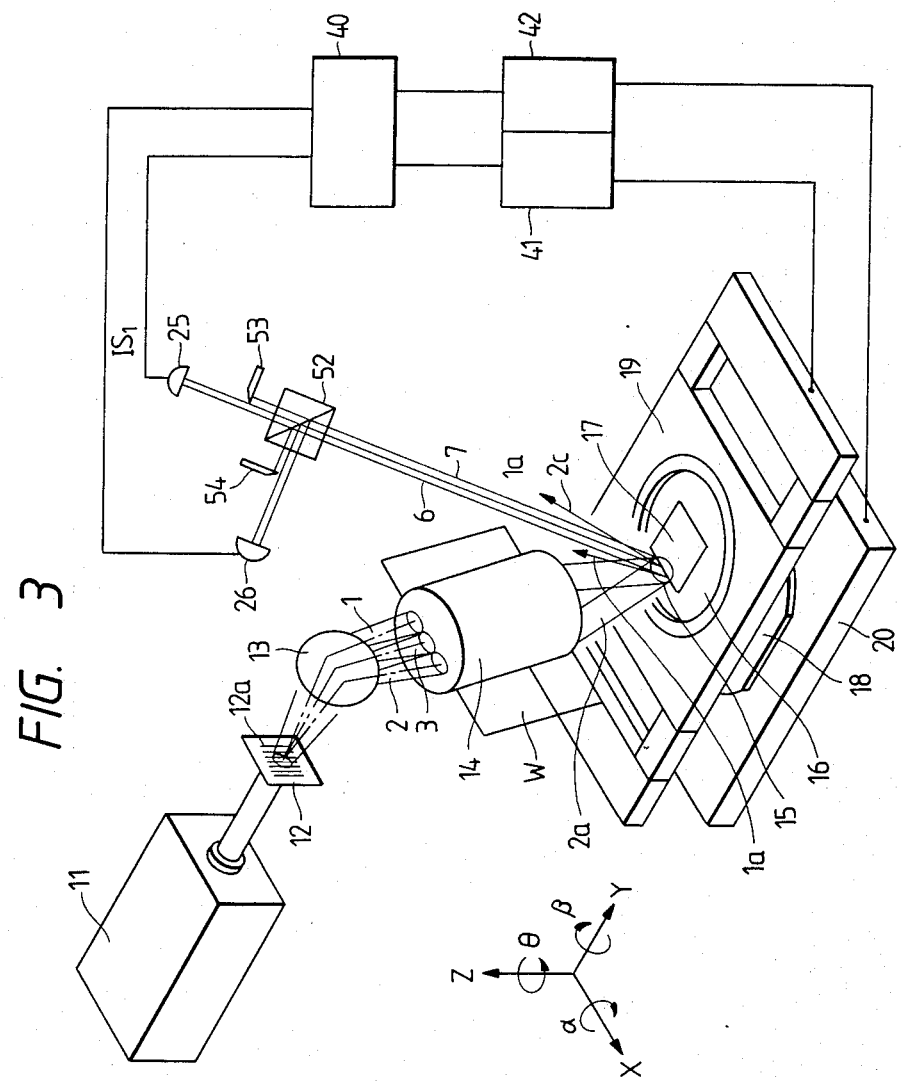
FIG. 3 is an illustration of the entire arrangement of a positioning apparatus according to a first embodiment of the present invention.
Figure 4:
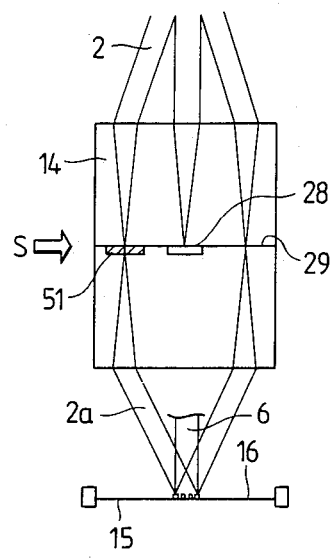
FIG. 4 shows an arrangemnet of a telecentric lens system used in the first embodiment.
Figure 5:
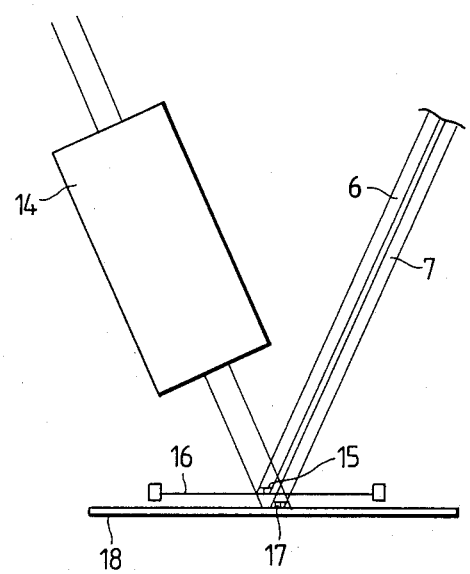
FIG. 5 is an illustration of diffracted light from second and third diffraction gratings disposed on a photomask and a wafer.

Referring now to FIG. 3, there is illustrated a positioning apparatus according to a first embodiment of the present invention. In FIG. 3, illustrated at numeral 11 is a Zeeman laser adapted to generate two-wavelength laser light whose frequencies f1 and f2 are slightly different from each other and whose polarized light are normal, i.e., at right angles, to each other. The two-wavelength laser light emitted therefrom is introduced into a reference grating device 12 comprising a first diffraction grating 12a, for example, having closely and equally spaced linear reflecting grooves whose pitch is P and further led onto a mirror 13 for reflection of the light incident thereon. Here, numeral 1 represents +1 order diffracted light made due to the laser beam being introduced into the reference grating device 12, numeral 2 designates −1 order diffracted light similarly made by the reference grating device 12, and numeral 3 depicts 0 order diffracted light similarly made thereby. These diffracted light 1, 2, 3 reach a both-side telecentric optical system 14 for illumination, the magnification of which is 1 and the numerical aperture NA of which is λ/P (λ is the laser light wavelength). The telecentric optical system 14, as shown in FIG. 4, is constructed as a lens system to have at a spectrum surface 29 a space filter 28 for cutting off the 0 order diffracted light 3 and further have a ½ wave plate 51 at the vicinity of the spectrum surface 29 disposed at the luminescent spot of the −1 order diffracted light 2. Reference 2a represents −1 order diffracted light after passed through the ½ wave plate 51, the polarizing direction of which is changed by 90° and numeral 15 designates a second diffraction grating which is of the reflection type having reflecting grooves with a pitch of P and which is disposed on a photomask 16. As shown in FIG. 5 which shows the optical arrangement viewed from an arrow S in FIG. 4, further provided is a third diffraction grating 17 which is of the reflection type having reflecting grooves of a pitch of P and which is installed on a wafer 18. The photomask 16 and wafer 18 are arranged in parallel to each other so as to have a constant gap therebetween which is of about 20 micrometers. Returning to FIG. 3, reference 2c represents (−1, 0) diffracted light made by reflection of the −1 order diffracted light 2a in the 0 order direction by means of the second and third diffraction gratings 15 and 17 and reference 1a designates (1, 0) diffracted light made by reflection of the +1 order diffracted light 1 in the 0 order direction by means of the second and third diffraction gratings 15 and 17. Furthermore, numeral 6 depicts first diffracted light from the second diffraction grating 15 which is a combination of diffracted light 2b (see FIG. 6) made with the −1 order diffracted light 2a being reflection-diffracted to the −1 order direction by means of the second diffraction grating 15 formed on the photomask 16 and diffracted light 1b (see FIG. 6) made with the +1 diffracted light 1 being reflection-diffracted in the +1 order direction by means of the second diffraction grating 15 formed thereon. Numeral 7 represents second diffracted light from the third diffraction grating 17 which is a combination of (−1, −1) diffracted light (not shown) made with the −1 order diffracted light 2a being reflection-diffracted in the −1 order direction by means of the third diffraction grating formed on the wafer 18 and (1, 1) diffracted light (not shown) made with the +1 order diffracted light 1 being reflection-diffracted in the +1 order direction by means of the third diffraction grating 17 formed thereon. Here, as shown in FIG. 5, while the first diffracted light 6 reflection-diffracted by the second diffraction grating 15 on the photomask 16 is coincident in advancing direction with the second diffracted light 7 reflection-diffracted by the third diffraction grating 17 on the wafer 18, they are slightly separated from each other so as not to overlap with each other because the second diffraction grating 15 is different in position from the third diffraction grating 17.

Returning again to FIG. 3, the first diffracted light 6 is introduced into a polarization beam splitter 52 whereby a portion (vertical polarization) of the first diffracted light 6 from the second diffraction grating 15 which is divided by the polarization beam splitter 52 to be directed in one polarizing direction is detected by a first detecting device 25. On the other hand, the second diffracted light 7 is also introduced into the same polarization beam splitter 52 whereby a portion (horizontal polarization) of the second diffracted light 7 from the third diffraction grating 17 which is divided thereby to be directed in one polarizing direction is detected by a second detecting device 26. The other portion (horizontal polarization) of the first diffracted light 6 divided thereby to be directed to the other polarizing direction is cut off by means of a knife edge 54 so as not to reach the second detecting device 26 and similarly the other portion (vertical polarization) of the second diffracted light 7 divided thereby to directed to the other polarizing direction is cut off by means of a knife edge 53 so as not to reach the first detecting device 25.

Also included in the optical positioning apparatus is a phase meter 40 which is coupled to the first and second detecting devices 25 and 26 for detecting the phases of light beat signals outputted therefrom in response to the receipt of the portions of the first and second diffracted light 6 and 7 through the polarization beam splitter 52 from the second and third diffraction gratings 15 and 17. The phase meter 40 is coupled to a photomask stage drive circuit 41 which drives the photomask stage 19 for mounting the photomask 16 so as to be movable in directions X, Y, Z and rotatable in a direction θ and further coupled to a wafer stage drive circuit 42 which drives the wafer stage 20 for mounting the wafer 18 so as to be movable in the directions X, Y, Z and rotatable in directions θ, α, β.

In the description made hereinbelow, with respect to the polarizing directions, the horizontal polarization is expressed using a suffix "(h)" and the vertical polarization is expressed using a suffix "(v)". Thus, in the case of the −1 order diffracted light with a frequency f1 and the horizontal polariztion, it is expressed as $U_{f1}(-1)_{(h)}$. Furthermore, in the case of the diffracted light made by two-time diffractions, it is expressed using two order values. For example, if the 1 order diffracted light of the vertical polarization and a frequency f2 is again subjected to −1 order diffraction, it is expressed as $U_{f2}(1,-1)_{(v)}$. Thus, the laser light emitted from the Zeeman laser 11 is expressed as $U_{f1}(0)_{(h)}$, $U_{f2}(0)_{(v)}$.

Figure 6:
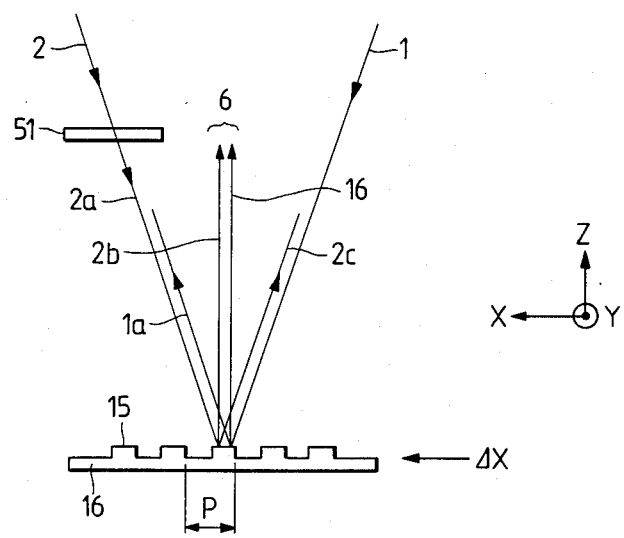
FIG. 6 is an illustration for describing the principal of the positioning according to the first embodiment.

A description will be made hereinbelow in terms of the positioning principal of the photomask 16 and the wafer 16 with reference to FIG. 6. In FIG. 6, the 1 order diffracted light 1 is expressed as $U_{F1}(1)_{(h)}$, $U_{f2}(1)_{(v)}$ and the −1 order diffracted light 2 is expressed as $U_{f1}(-1)_{(h)}$, $U_{f2}(-1)_{(v)}$. The −1 order diffracted light 2a is obtained by the passing of the 1 order diffracted light 2 through the ¼ wave plate 51 and the polarizing direction thereof is varied by 90°, and therefore the −1 order diffracted light 2a can be expressed as $U_{F1}(-1)_{(v)}$, $U_{f2}(-1)_{(h)}$, (−1)(v), Uf2(−1)(h), whereas the diffracted light 2b is obtained by the −1 order diffraction of the −1 order diffracted light 2a by means of the second diffraction grating 15 and hence it can be expressed as $U_{f1}(-1, -1)_{(v)}$, $U_{f2}(-1, -1)_{(h)}$. Furthermore, the diffracted light 1b is obtained by the 1 order diffraction of the 1 order diffracted light 1 by means of the second diffraction grating 15 and hence it can be expressed as $U_{f1}(1, 1)_{(h)}$, f1(1, 1)(h), $U_{f2}(1, 1)_{(v)}$.

Here, the complex amplitude of the diffracted light 2b is given in accordance with the following equations (1) and (2) and the complex amplitude of the diffracted light 1b is given in accordance with the following equations (3) and (4):

$$U_{f1}(-1, -1)_{(v)} = A_1 \exp i(2\pi f1 t -)\delta \quad (1)$$

$$U_{f2}(-1, -1)_{(h)} = A_2 \exp i(2\pi f2 t - \delta) \quad (2)$$

$$U_{f1}(1, 1)_{(h)} = A_1 \exp i(2\pi f1 t + \delta) \quad (3)$$

$$U_{f2}(1, 1)_{(v)} = A_2 \exp i(2\pi f2 t + \delta) \quad (4)$$

where t is time and $\delta = 2\pi \cdot \Delta X/P$ and the variable δ is due to displacement of the second diffraction grating 14 by ΔX in the X-direction.

Since the diffracted light 2b and 1b are presented on the same optical path, the $U_{f1}(-1, -1)_{(v)}$ of the equation (1) and $U_{f2}(1, 1)_{(v)}$ of the equation (4) are coincident in the polarizing direction with each other, thereby resulting in interference with each other so as to cause a combination thereof. The combined light E(v)1 is expressed as follows.

$$E(v)1 = U_{f1}(-1, -1)_{(v)} + U_{f2}(1, 1)_{(v)} = \quad (5)$$

$$A_1 \exp i(2\pi f1 t - \delta) + A_2 \exp i(2\pi f2 t + \delta)$$

Similarly, $U_{f1}(-1, -1)_{(h)}$ of the equation (2) and $Uf_{f1}(1, 1)_{(h)}$ of the equation 3 are combined with each other on the optical path and the combined light E(h)1 is expressed as follows.

$$E(h)1 = U_{f1}(1, 1)_{(h)} + U_{f2}(-1, -1)_{(h)} = \quad (6)$$

$$A_1 \exp i(2\pi f1 t + \delta) + A_2 \exp i(2\pi f2 t - \delta)$$

The first diffracted light 6 comprises the combined light E(v)1 and E(h)1 which are not in interference relation on the optical path to each other because they are normal to each other. Here, if detecting the light intensity Is1 of only the E(v)1 component by division, the light intensity Is1 is expressed in accordance with the following equation.

$$L_s1 = |E(v)1|^2 = A_1^2 + A_2^2 + 2A_1A_2 \cos(2\pi(f1-f2)t - 2\delta) \quad (7)$$

In the equation (7), the third term is referred as a light beat signal which results in an alternating current signal with a frequency of (f1−f2). When the second diffration grating 15 is moved by ΔX, the phase of the light beat signal expressed by the third term of the equation (7) is varied by $4\pi \cdot \Delta X/P$ (radian). When the phase of the light beat signal is detected in unit of 1° (actually, it is possible to detect it in unit of smaller value), ΔX=P/720 and therefore the detection resolution becomes 2.8 nm in the case that the grating pitch is 2 micrometers. This is, the movement amount ΔX of the second diffraction grating 15 can be detected by detecting the light beat signal. In this embodiment, E(v)1 and E(h)1 of the first diffracted light 6 is divided by the polarization beam splitter 52 and the divided E(v)l is converted by the detecting device 25 into the corresponding light intensity Isl to detect the light beat signal.

As well as the detection of the movement amount ΔX of the second diffraction grating 15, it is possible to detect the movement amount ΔX' of the third diffraction grating 17 disposed on the wafer 18. The second diffracted light diffracted by the third diffraction grating 17 can be expressed by the following equations (8) and (9) as well as the equations (5) and (6).

$$E(v)2 = U_{f1}(-1, -1)_{(v)} + U_{f2}(1, 1)_{(v)} = \quad (8)$$

$$A_1 \exp i(2\pi f1 t - \delta') + A_2 \exp i(2\pi f2 t + \delta')$$

$$E(h)2 = U_{f1}(1, 1)_{(h)} + U_{f2}(-1, -1)_{(h)} = \quad (9)$$

$$A_1 \exp i(2\pi f1 t + \delta') + A_2 \exp i(2\pi f2 t - \delta')$$

Where $\delta' = 2\pi \cdot \Delta X'/P$.

Here, if detecting, by the second detecting device 26, the light intensity Is2 corresponding to only the E(h)2 component divided by means of the polarization beam splitter 52, the light intensity Is2 is expressed in accordance with the following equation.

$$L_s2 = |E(h)2|^2 = A_1^2 + A_2^2 + 2A_1A_2 \cos(2\pi(f1=f2)t + 2\delta') \quad (10)$$

The phase difference Δφ between the light beat signal expressed by the equation (7) and detected by means of the first detecting device 26 and the light beat signal expressed by the equation (10) and detected by means of the second detecting device 26 can be given in accordance with the following equation.
Here, if $\Delta X' = \Delta X - \Delta X_{(h)}$, it is rewritten as follows:

$$\Delta = 4\pi \Delta X_{(h)}/P \quad (12)$$

where $\Delta_{(h)}$ is the relative movement amount between the photomask 16 and the wafer 18.

Thus, with the comparison between the phases of the light beat signals detected by the first and second detecting devices 25 and 26, the relative movement amount between the photomask 16 and the wafer 18 can be detected as a signal represneting the difference in position between the photomask 16 and the wafer 18, and if the photomask stage 19 and the wafer stage 20 are controlled in position by means of the photomask stage drive circuit 41 and the wafer stage drive circuit 42 on the basis of the detected position difference signal, this allows the positioning between the photomask 16 and the wafer 18 with high accuracy.

In this embodiment, since the ½ wave plate 51 is used, it is not necessary to use a phase plate in order to combine the diffracted light and it is possible to prevent the loss of the corresponding light quantity. Furthermore, since it is possible to greatly obtain the variation of the phase angle with respect to the movement of the diffraction grating, the sensitivity thereof is improved under the condition that the pitch of the diffraction grating is same.

Although the above description is made for simplicity such that the positioning between the photomask 16 and the wafer 18 is made with respect to one direction using a pair of second and third diffraction gratings 15 and 17 which are equal in pitch to each other, in practice plural pair of the second and third diffraction gratings are disposed on the photomask 16 and the wafer 18 so as to allow the positioning therebetween with respect to plural directions (for example, X, Y, θ). Furtehrmore, although in the above-described embodiment the ½ wave plate 51 is placed on the spectrum surface 29 of the illumination optical system 14, it is also appropriate to place it between the reference grating 12 and the illumination optical system 14, resulting in the same effect. Furthermore, although in this embodiment the separation of E(v) and R(h) is effected by means of the polarization beam splitter 52 and the knife edges 53, 54, the same effect can be obtained using other devices such as a combination of a beam splitter, a polarization plate and a knife edge mirror.

According to the above-described embodiment, the diffracted light from the reference grating selectively passes through the illumination optical system and reaches the other reference grating along the specific direction determined by the numerical aperture NA of the illumination optical system. Therefore, unnecessary diffracted light is removed so as to improve the S/N of the detection signal. Furthermore, the light beat signals are obtained using two light beams, passing through the same optical path, whose frequencies is slightly different from each other and whose polarizing surfaces are normal to each other. This allows reduction of the variation of the gap between the photomask and the wafer and the variation factors in the optical path.

Figure 7:
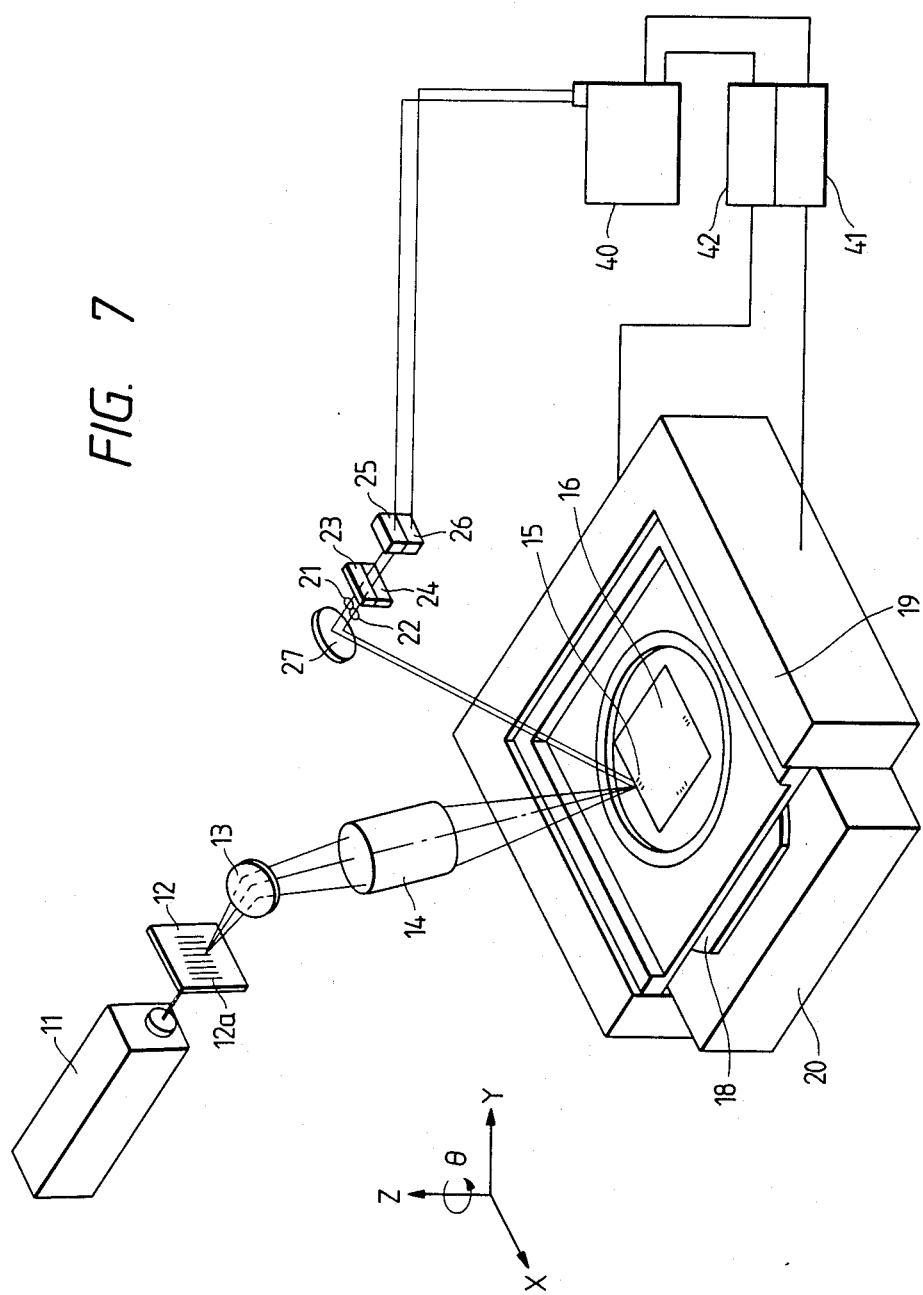
FIG. 7 shows an optical arrangement of a positioning apparatus according to a second embodiment of the present invention.

A positioning apparatus according to a second embodiment of the present invention will be described hereinbelow with reference to FIGS. 7 through 9, in which parts corresponding to those in FIG. 3 are marked with the same numerals and characters. FIG. 7 is a perspective view showing the entire arrangement of the positioning apparatus of th second embodiment, FIG. 8 is an illustration for describing the optical relation between a telecentric lens system and diffraction gratings, and FIG. 9 shows the relation in position between a photomask and a wafer.

Figure 8:
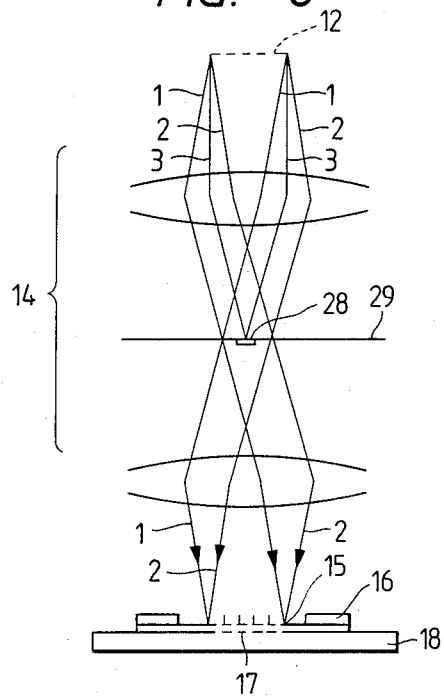
FIG. 8 is an illustration for describing the optical relation between a telecentric lens system and diffraction gratings used in the second embodiment.
Figure 9:
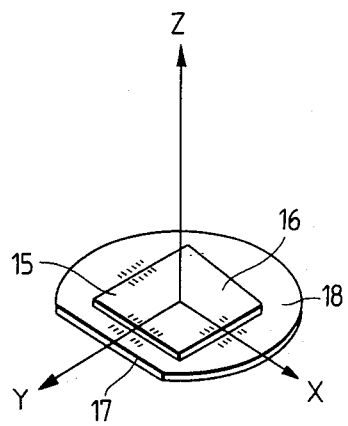
FIG. 9 shows the relation in position between a photomask and wafer.

In FIGS. 7 to 9, illustrated at numeral 11 is a Zeeman laser for generating two-wavelength laser light which are slightly different in frequency from each other and which are normal in polarizing direction to each other. The laser light from the Zeemn laser 11 is introduced into a reference grating 12 having a first diffraction grating 12a whose the pitch of the grooves is P and, after passed through the reference grating 12, the laser beam path is changed by means of a mirror 13. The light reflected by the mirror 13 is introduced into a both-side telecentric lens 14 whose magnification is 1 and whose numerical aperture NA is $\lambda/P$ ($\lambda$ is the wavelength of the laser light). The telecentric lens 14, as shown in FIG. 8, has on its spectrum surface 29 a space filter 28 for cutting off 0 order diffracted light 3. After passed through the telecentric lens 14, the diffracted light reaches a second diffraction grating 15 which is of the reflection type having a pitch of P and which is disposed on a photomask 16 and further reaches a third diffraction grating 17 which is of the reflection type having a pitch of P and which is placed on a wafer 18. The photomask 16 and the wafer 18 is kept in parallel to each other so as to form a uniform gap of 20 micrometers therebetween. The photomask 16 is held on a photomask stage 19 which is movable and rotatable in directions of X, Y, Z, θ indicated in FIG. 7 and the wafer 18 is held on a wafer stage 20 which is movable and rotatable in directions of X, Y, Z θ, α, β. The diffracted light from the second and third diffraction gratings 15, 17 are led through a mirror 27 into microlenses 21 and 22 for condensing the 0 order diffracted light and −2 order diffracted light from the second and third diffraction gratings 15, 17, i.e., (+1, 0), (−1, −2) expressed by two values using the diffraction orders of the reference grating 12 and second and third diffraction gratings 15, 17. After passed through the microlenses 21 and 22, the light is introduced into first and second phase plates 23 and 24 whereby the polarizing direction of the laser light is rotated by 45° and the two-wavelength light with frequencies of f1 and f2 is permitted to become coherent light and then led into first and second detecting devices for respectively measuring the light intensities of the condensed light due to the microlenses 21 and 22. Also including in the positioning apparatus is a phase meter 40 for detecting phases of light beat signals outputted from the first and second detecting devices 25 and 26. The phase meter 40 is coupled to a photomask stage drive circuit 41 for driving the photomask stage 19 and a wafer stage drive circuit 42 for driving the wafer stage 20.

A description will be made hereinbelow in terms of the principal of the positioning of the photomask 16 with respect to the wafer 18 with reference to FIG. 10 in which a solid line A shows the state that the second diffration grating 15 formed on the photo mask 16 is accurately positioned with respect to the reference diffraction grating 12 and a dotted light B shows the state that the second diffraction grating 15 is shifted by ΔX with respect to the position thereof shown by the solid line A. In FIG. 10, numeral 1 represents +1 order diffracted light led from the reference diffraction grating 12 through the both-side telecentric lens 14 and numeral 2 designates −1 order diffracted light similarly led from the reference diffraction grating 12 therethrough. Furthermore, numeral 4 is 0 order diffracted light from the second diffraction grating 15 and numeral 5 depicts −2 order diffracted light therefrom, the diffrated light 4 and 5 are respectively (+1, 0), (−1, −2) under the condition of two-value expression.

Here, the complex amplitudes of the diffracted light (+1, 0), (−1, −2) each having a frequency of f1 are respectively expressed in accordance with the following equations:

$$E_{f1}(+1, 0) = A_1 \exp(i\omega_1 t) \quad (13)$$

$$E_{f1}(-1, -2) = A_2 \exp i(\omega_1 t + 2\delta) \quad (14)$$

where $\omega 1 = 2\pi \cdot f1$ and $\delta = 2\pi \cdot \Delta X/P$.

$$E_{f1} = C_1 \exp\{i(\psi_1 t + \Delta 1)\} \quad (15)$$

be expressed by the following equation (15). when $A_2/A_1$ is $\alpha$, $$C_1 = A_1\{1 + \alpha^2 + 2\alpha\cos(2\delta)\}^{\frac{1}{2}} \quad (16)$$

$$\Delta 1 = \tan^{-1}\left(\frac{\alpha \sin 2\delta}{1 + \alpha \cos 2\delta}\right) \quad (17)$$

Similarly, the diffracted light (+1, 0), (−1, −2), each having a frequency of f2 interfere each other so as to be expressed by the following equation (18).

$$E_{f2} = C_2 \exp\{i(\psi_2 t + \Delta 2)\} \quad (18)$$

When $A_2/A_1'$ is $\beta$, $$C_2 = A_1'\{1 + \beta^2 + 2\beta\cos(2\delta)\}^{\frac{1}{2}} \quad (19)$$

$$\Delta 2 = \tan^{-1}\left(\frac{\beta \sin 2\delta}{1 + \beta \cos 2\delta}\right) \quad (20)$$

The diffracted light with frequency f1 and the diffracted light with frequency f2, after passed through the microlens 21, are combined with each other by means of the first phase plate 23 and the beat signal intensity Is1 detected by the first detecting device 25 is given in accordance with the following equation (21):

$$Is1 = |E_{f1} + E_{f2}|^2 = \quad (21)$$
$$C_1^2 + C_2^2 + 2C_1C_2 \cos\{(\omega_1 - \omega_2)t + (\Delta 1 - \Delta 2)\}$$

here, $$\Delta 1 - \Delta 2 = \tan^{-1}\left(\frac{(\beta - \alpha)\sin 2\delta}{1 + \alpha\beta + (\alpha + \beta)\cos 2\delta}\right) \quad (22)$$

thus, the light beat signal to be detected includes the phase shift corresponding to the position difference $\Delta X$.

On the other hand, with respect to the wafer 18, using the second phase plate 24 and the second detecting device 26, the light beat signal intensity Is1' corresponding to the phase variation due to the position difference $\Delta X'$ of the wafer 16 with respect to the reference diffraction grating 12 is similarly given in accordance with the following equation (23).

$$Is1' = |E_{f1} + E_{f2}|^2 = \quad (23)$$
$$C_1^2 + C_2^2 + 2C_1C_2 \cos\{(\omega_1 - \omega_2)t + (\Delta 1' - \Delta 2')\}$$

Therefore, the phase difference $\Delta \beta$ between the light beat signal intensities Is1 and Is1' is given in accordance with the following equation (24).

$$\Delta \phi = (\Delta 1 - \Delta 2) - (\Delta 1' - \Delta 2') \quad (24)$$

Figure 11:
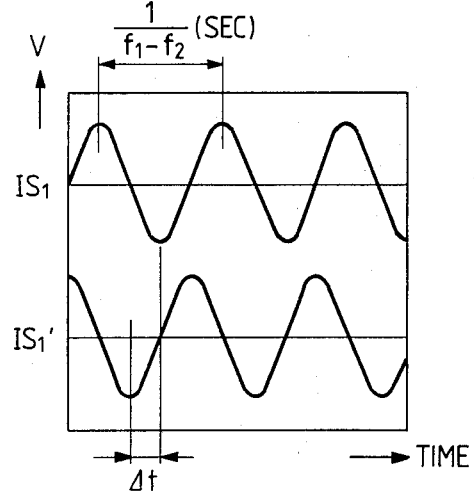
FIG. 11 shows light beat signals due to diffracted light from diffraction gratings.

FIG. 11 is an illustration of the light intensities Is1 and Is2 obtained by means of an oscilloscope. From the illustration of FIG. 11, the following relation can be given with respect to time $\Delta t$:

$$\Delta \phi = 2\pi \cdot \Delta t(f1 - f2) \quad (25)$$

Since in this second embodiment the phase difference $\Delta \phi$ between the intensities Is1 and Is1' is directly detected by means of the phase meter 40, without obtaining the time $\Delta t$ it is possible that $\Delta \phi$ extremely approaches zero by adjusting the relative position between the photomask 16 and the wafer 18. In the case that $\Delta \phi$ is adjusted to be below 1° ($1.7 \times 10^{-2}$ radians), the positioning accuracy becomes 1 to 10 micrometers, this being extremely high positioning accuracy.

Furthermore, since each of the diffracted light 1 and 2 includes two-wavelength light with freqiencies f1 and f2, the affection to the positioning accuracy due to variation factors such as air fluctuation on the optical path can be extremely reduced. In addition, since as seen from FIG. 9 the second diffraction grating 15 on the photomask 16 and the third diffraction grating 17 on the wafer 18 are disposed to be slightly shifted from each other, it is possible to independently detect the light beat signal from the second diffraction grating 15 which can provide the information relating to position-shift of the photomask 16 and the light beat signal from the third diffraction grating 17 which can provide the information relating to the position-shift of the wafer 18, thereby resulting in reducing the influence to the positioning accuracy due to the variation of the gap between the photomask 16 and the wafer 18.

In the actual positioning, using a high-magnification ITV camera (not shown), a combination of the reference diffraction grating 12, photomask 16 and wafer 18 is made with accuracy below ¼ of the grating pitch P and then the photomask stage 19 or the wafer stage 20 is slightly moved so that the phase difference of the light beat signals from the first and second detecting devices 25 and 26 becomes 0° to perform the positioning of the photomask 16 with respect to the wafer 18 with high accuracy.

Figure 12:
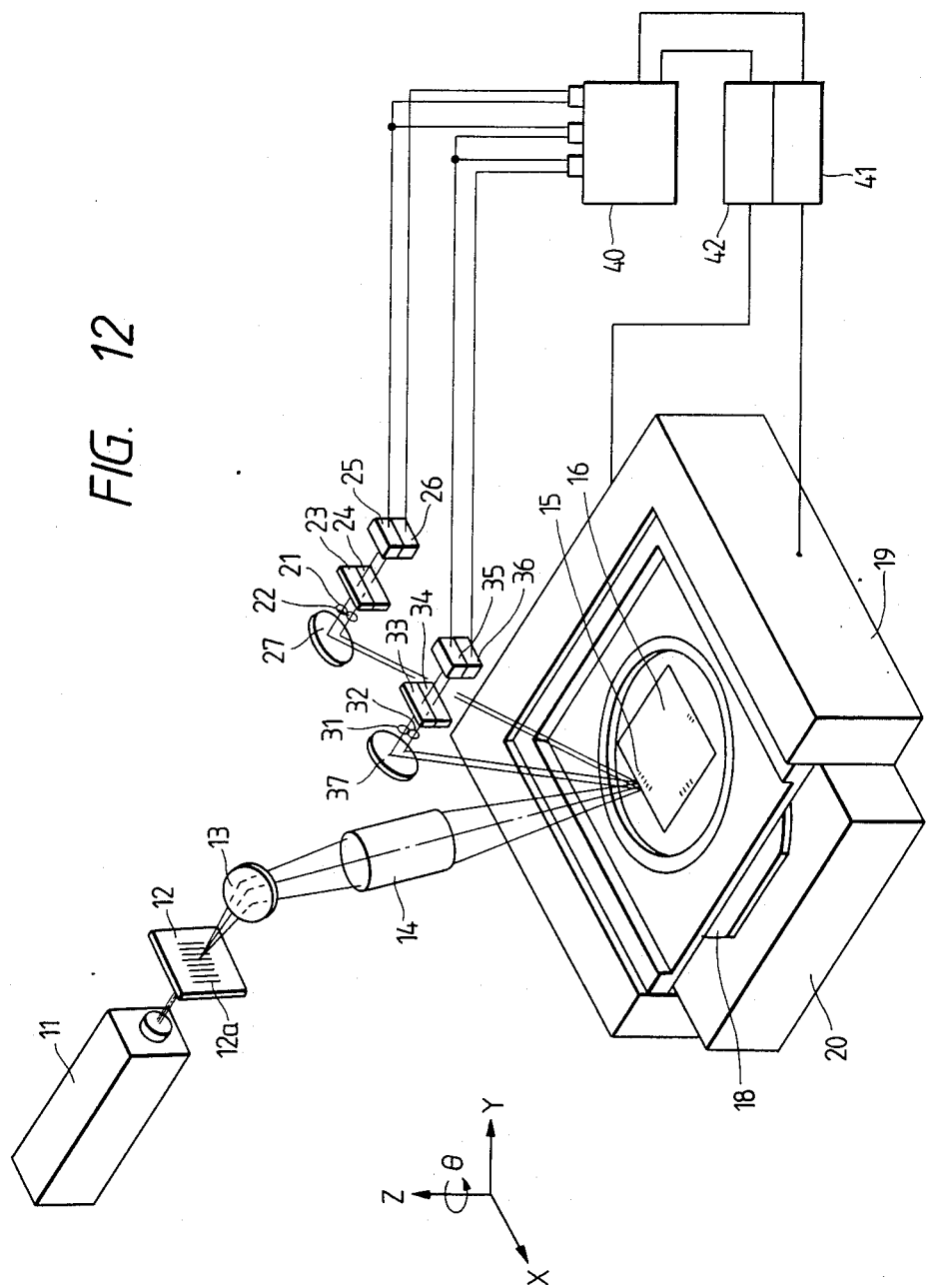
FIG. 12 shows an optical arrangement of a positioning apparatus according to a third embodiment of the present invention.

A third embodiment of the present invention will be described hereinbelow with reference to FIG. 12 which is a perspective view of the entire arrangement of an positioning apparatus of the third embodiment and in which parts corresponding to those in FIGS. 1 and 7 are marked with the same numerals and the description thereof will be omitted for brevity. One feature of the third embodiment is to using two diffracted light from second and third diffraction gratings respectively disposed on a photomask 16 and a wafer 18. In FIG. 12, illustrated at numerals 31 and 32 are microlenses for condensing diffracted light (−1, 0), (1, −2) supplied from the second and third diffraction gratings 15 and 17 through a mirror 37 for changing the optical path direction. The condensed diffracted light are introduced into third and fourth phase plates 33 and 34 whereby the polarizing direction of the laser light is rotated by 45° and the two-wavelength light with frrequencies f1 and f2 interfere each other. At the rear of the third and fourth phase plates 33 and 34, third and fourth detecting devices 35 and 36 are provided in order to measure the intensities of the condensed light due to the microlenses 31 and 32. The output signals, i.e., light beat signals, of the third and fourth detecting devices 35 and 36 as well as the output signals of first and seond detecting devices 25 and 26 are supplied to a multi-channel phase meter 40 for detecting the phases of the light beat signals therefrom.

Figure 13:
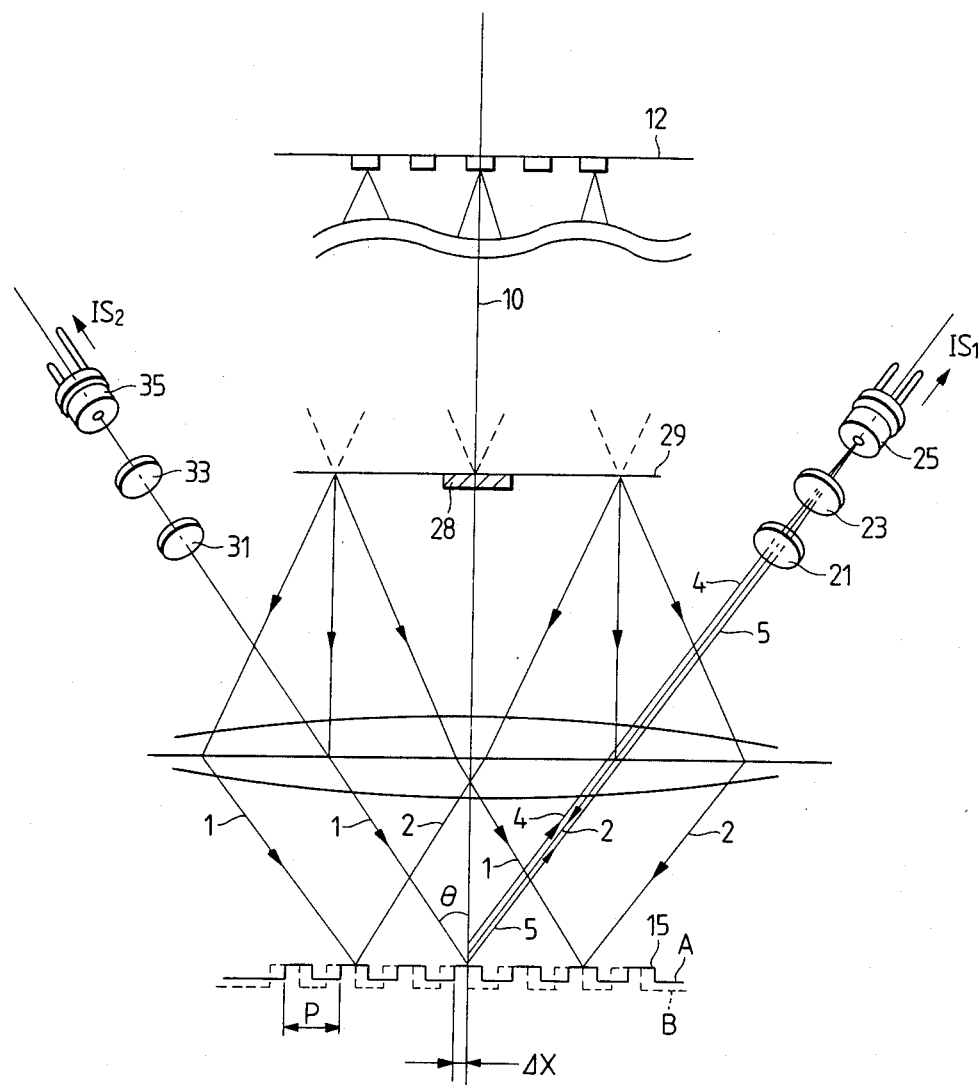
FIG. 13 is an illustration for describing the principal of the positioning in the third embodiment.

A description in terms of only the positioning of the photomask 16 will be made hereinbelow with reference to FIG. 13 (a description of the positioning of the wafer 18 will be omitted because it is substantially similar to the positioning of the photomask 16). In FIG. 13, a solid line A shows the state a second diffraction grating 15 disposed on the photomask 16 is accurately positioned with respect to a reference diffraction grating 12 and a dotted line B shows the state that it is shifted by ΔX with respect to the accurate position thereof shown by the solid line A. Numeral 1 represents +1 order diffracted light led from the reference diffraction grating 12 through a both-side telecentric lens 14 and numeral 2 designates −1 order diffracted light led therefrom through the both-side telecentric lens 14. Furthermore, numeral 4 is 0 order diffracted light from the second diffraction grating 15 and numeral 5 depicts −2 order diffracted light therefrom. The diffracted light 4 and 5 are respectively (+1, 0), (−1, 2) in accordance with the two-value expression.

After passed through the microlens 21, the diffracted light with the frequency f1 and the diffracted light with the frequency f2 are combined with each other by means of a first phase plate 23, and the light beat signal intensity Is1 obtained by the first detecting device 25 is given in accordance with the equation (21) as well as in the above-mentioned case. That is:

$$Is1 = |E_{f1} + E_{f2}|^2 = \qquad (21)$$
$$C_1^2 + C_2^2 + 2C_1C_2 \cos\{(\omega_1 - \omega_2)t + (\Delta 1 - \Delta 2)\}$$

similarly, $$\Delta 1 - \Delta 2 = \tan^{-1}\left(\frac{(\beta - \alpha)\sin 2\delta}{1 + \alpha\beta + (\alpha + \beta)\cos 2\delta}\right) \qquad (22)$$

Therefore, the light beat signal including the phase shift corresponding to the position difference ΔX can be given.

On the other hand, by the third detecting device 35 being in symmetrical position relation to the first detecting device 25 with respect to the optical axis of the both-side telecentric lens 14, the light intensity Is2 is obtained, and therefore the phase difference Δφ can be given in accordance with the following equation (26).

$$\Delta\phi = 2(\Delta 1 - \Delta 2) = 2\tan^{-1}\left(\frac{(\beta - \alpha)\sin 2\delta}{1 + \alpha\beta + (\alpha + \beta)\cos 2\delta}\right) \qquad (26)$$

As well as in the above-mentioned embodiment, the light intensities Is1, Is2 with respect to the time Δt are
$$\delta = 2\pi \cdot \Delta X/P \qquad (28)$$
in accordance with this relation, δ can be obtained as follows:
$$\delta = 2\pi \cdot \Delta X/P \qquad (28)$$

as a result, the position difference of the photomask 16 with respect to the reference diffraction grating 12 can be obtained.

Similarly, since in this embodiment the phase difference bwteeen the intensities Is1 and Is2 is directly detected by means of the phase meter 40, without obtaining the time Δt Δφ is directly detectable with an accuracy below 1° ($1.7 \times 10^{-2}$ radians). In the case that Δφ is detected with resolution of 1°, the positioning difference of to 10 micrometers can be detectable, this being extremely high positioning accuracy.

Furthermore, since each of the diffracted light 1 and 2 includes two-wavelength light with freqiencies f1 and f2, the affection to the positioning accuracy due to variation factors such as air fluctuation on the optical path can be extremely reduced. In addition, since as seen from FIG. 9 the second diffraction grating 15 on the photomask 16 and the third diffraction grating 17 on the wafer 18 are disposed to be slightly shifted from each other, it is possible to independently detect the light beat signal from the second diffraction grating 15 which can provide the information relating to position-shift of the photomask 16 and the light beat signal from the third diffraction grating 17 which can provide the information relating to the position-shift of the wafer 18, thereby resulting in reducing the influence to the positioning accuracy due to the variation of the gap between the photomask 16 and the wafer 18.

In the actual positioning, using a high-magnification ITV camera (not shown), a combination of the reference diffraction grating 12, photomask 16 and wafer 18 is made with accuracy below ¼ of the grating pitch P and then the photomask stage 19 is slightly moved so that the phase difference of the light beat signals from the first and third detecting devices 25 and 35 becomes 0° to peform the positioning of the photomask 16 with respect to the wafer 18 with high accuracy. Thereafter, the wafer stage 20 is slightly moved so that the phase difference the light beat signals from the first and second detecting devices 25 and 26 becomes 0° so as to perform perform an accurate positioning of the wafer 18 with respect to the photomask 16. With the above-mentioned operation, the positioning between the photomask 16 and the wafer 18 are completed.

Here, although in the actual positioning process the positioning of the photomask 16 with respect to the reference diffraction grating 12 is performed by suing the first and third detecting devices 25 and 35 and then the positioning of the wafer 18 with respect to the photomask 16 is effected by using the first and second detecting devices 25 and 26, it is also appropriate that the positioning of the wafer 18 with respect to the refeence diffraction grating 12 is first performed by detecting the phase difference of the light beat signals from the second and fourth detecting devices 26 and 36 and then the positioning of the photomask 16 with respect to the wafer 18 is effected on the basis of the phase difference between the light beat signals from the first and second detecting devices 25 and 26, resulting in the same effect.

Therefore, in the third embodiment it is allowed to remove either of the third phase plate 33 and third detecting device 35 or the fourth phase plate 34 and fourth detecting device, and an accurate positioning can be performed with a combination of the first phase plate 23 and first detecting device 25, the second phase plate 24 and second detecting device 26, and either of the third phase plate 33 and third detecting device 35 or the fourth phase plate 34 and fourth detecting device.

A further description in terms of another actual positioning method in this embodiment will be made hereinbelow. That is, similarly, using a high-magnification ITV camera (not shown), a combination of the reference diffraction grating 12, photomask 16 and wafer 18 is made with accuracy below ¼ of the grating pitch P and then the photomask stage 19 is slightly moved so that the phase difference of the light beat signals from the first and third detecting devices 25 and 35 becomes 0° to peform the positioning of the photomask 16 with respect to the wafer 18 with high accuracy. Thereafter, the wafer stage 20 is slightly moved so that the phase difference the light beat signals from the second and fourth detecting devices 26 and 36 becomes 0° so as to perform perform an accurate positioning of the wafer 18 with respect to the reference diffraction grating 12. Thus, the positioning between the photomask 16 and the wafer 18 are completed with the photomask 16 and the wafer 18 being accurately positioned with respect to the reference diffraction grating 12.

Although in the above-description the positioning is made with respect to one direction, if performing the positioning with respect to multi-directions, pluralities of the second and third diffraction gratings 15 and 17 are provided on the photomask 16 and the wafer 18.

Figure 14:
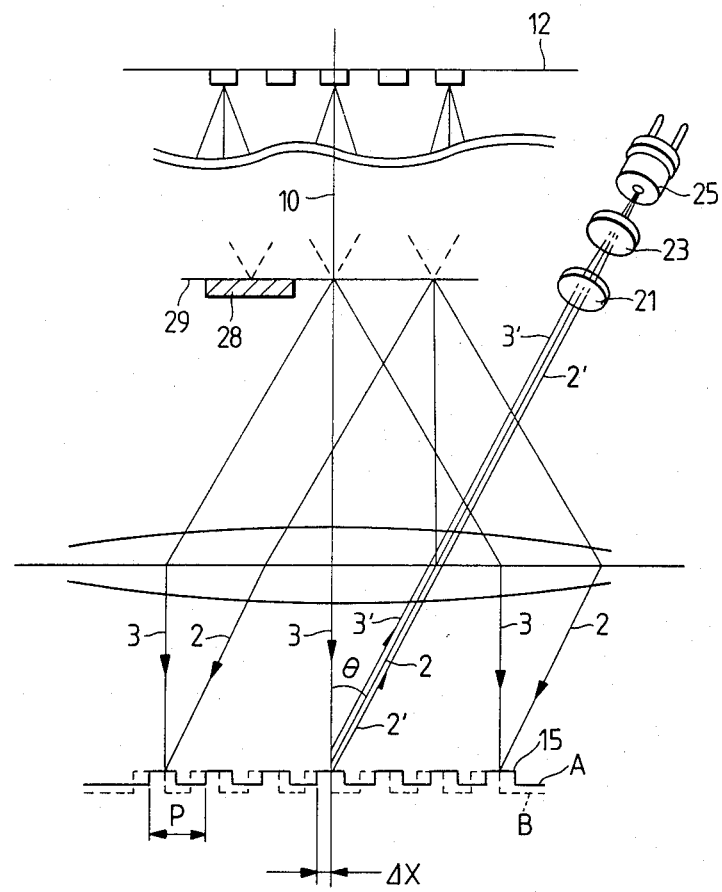
FIG. 14 is an illustration for describing the principal of the positioning in a fourth embodiment of this invention.

A fourth embodiment of the present invention will be described hereinbelow with respect to FIG. 14, in which parts corresponding to those in FIG. 7 are marked with the same numerals and the detailed description will be omitted for brevity. The basic arrangements of the second and fourth embodiments are substantially similar to each other but there is the difference therebetween in terms of the diffracted light from a reference diffraction grating 12 to be cut off through a telecentric lens 14 being different from each other. That is, as shown in FIG. 14, of the diffracted light from the reference diffraction grating 12, 1 order diffracted light is cutt off through the telecentric lens 14 and $-1$ order diffracted light and 0 order diffracted light respectively pass through the telecentric lens 14 and futher diffracted by means of the second diffraction grating 15. The grating pitch P is given by $P = \lambda/NA$ where NA is the grating-side numerical aperture of the telecentric lens 14 and $\lambda$ is a wavelength to be used.

Thus, the 0 order diffracted light 3 from the reference diffraction grating 12 results in $+1$ order diffracted light 3' due to the second diffraction grating 15 and the $-1$ order diffracted light 2 results in $-2$ order diffracted light 2', they going in the same optical path and then reaching the first detecting device 25. In this case, the light beat signal $Is1$ to be detected by the first detecting device 25 can be given in accordance with the above-mentioned equation (21), that is, $$Is1 = |E_{f1} + E_{f2}|^2 = \qquad (21)$$
$$C_1{}^2 + C_2{}^2 + 2C_1C_2 \cos\{(\omega_1 - \omega_2)t + (\Delta 1 - \Delta 2)\}$$

however, unlike the case of the second embodiment, $$\Delta 1 - \Delta 2 = \tan^{-1}\left(\frac{-(\beta - \alpha)\sin 3\delta}{1 + 2\beta + (\alpha + \beta)\cos 3\delta}\right)$$

$$C_2 = A_1' \{1 + \beta^2 + 2\beta \cos 3\delta\}^{\frac{1}{2}}$$

$$C_1 = A_1 \{1 + \beta^2 + 2\alpha \cos 3\delta\}^{\frac{1}{2}}$$

This light beat signal includes the phase variation due to a position difference $\Delta X$ of the second diffraction grating 15, i.e., the photomask 16 with respect to the reference diffraction grating 12. On the other hand, similarly obtained is a light beat signal including the information corresponding to the position difference $\Delta X$ of the wafer 18 with respect to the reference diffraction grating 12. Therefore, the relative positioning between the photomask 16 and the wafer 18 can be performed with the photomask stage 19 or the wafer stage 20 being slight adjusted in position so that the phase difference between the above-mentioned two light beat signals results in zero.

Thus, according to the fourth embodiment as well as the second and third embodiments, since the diffracted light from the reference grating 12 are selectively obtained through the illumination optical system 14 and then directed to the positioning diffraction grating 15 along a specific direction determined by the numerical aperture NA of the illumination optical system 14, unnecessary diffracted light are removed so as to improve the S/N of the detection signal. Furthermore, since a plurality of light beat signals are obtained using two light beams which pass through the same optical path and which are slightly different in frequency from each other and the position difference amount of the photomask 16 or the wafer 18 with respect to the reference grating 12 is detected on the basis of the pgase difference therebetween, it is possible to prevent the variation of the gap between the photomask 16 and the wafer 18 and the deterioration of the positioning accuracy due to the variation factors in the optical path, thereby resulting in allowing the positioning thereof with high accuracy.

A fifth embodiment of the present invention will be described hereinbelow with reference to FIGS. 15 and 16 in which parts corresponding to those in Figures for the first and fourth embodiments are marked with the same numerals.

Figure 15:
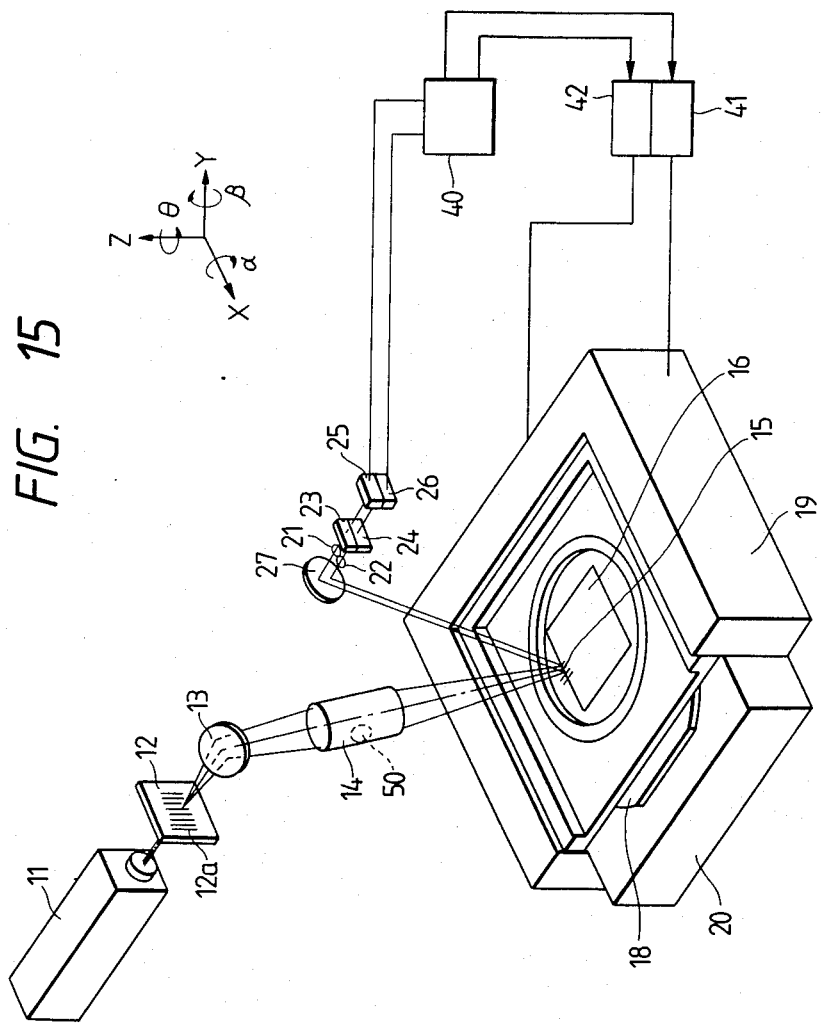
FIG. 15 shows an arrangement of a positioning apparatus according to a fifth embodiment of this invention.
Figure 16:
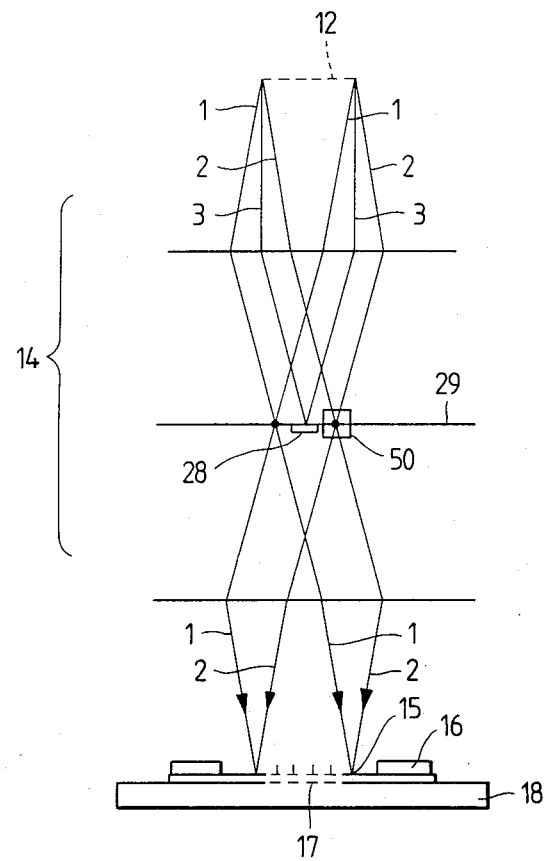
FIG. 16 shows an arrangement of a telecentric lens system used in the fifth embodiment.

In FIG. 15 showing the entire arrangement of a positioning apparatus of the fifth embodiment, a Zeeman laser device 11 generates two-wavelength light which are slightly different in frequency from each other and whose polarizing directions are perpendicular to each other, the generated two-wavelength light passes through a reference diffraction grating device 12 including a first diffraction grating 12a whose reflecting groove pitch is P and are further introduced through a mirror 13 for changing the light-advancing direction into a both-side telecentric lens 14. The telecentric lens 14 has a magnification of 1 and a numerical aperture NA of $\lambda/P$ where $\lambda$ is the laser wavelength and, as shown in FIG. 16, includes on its spectrum surface 29 a space filter 28 for cutting off 0 order diffracted light 3. After passed through the telecentric lens 14, the diffracted light reach a second diffraction grating 15 which is of the reflection type having a pitch of P and which is disposed on photomask 16 and further reach a third diffraction grating 17 which is of the reflection type having a pitch of P and which is disposed on a wafer 18. The photomask 16 and the wafer 18 are arranged in parallel to each other so as to have a gap of 20 micrometers therebetween. The photomask 16 is placed on a photomask stage 19 which is movable and rotatable in directions indicated by X, Y, Z, $\theta$ in FIG. 15 and the wafer 18 is placed on a wafer stage 20 which is movable and rotatable in directions of X, Y, Z, $\theta\alpha$, $\beta$ in FIG. 15. Microlenses 21 and 22 are respectively provided in order to condense the +1 order diffracted light and -1 order diffracted light from the second and third diffraction gratings 15 and 17, i.e., (+1, +1), (−1, −1). Thereafter, the diffracted light reach first and second phase plates 23, 24 whereby the polarizing direction of the laser light is rotated by 45° and the two-wavelength light with frequencies f1 and f2 are allowed to interfere each other. Furthermore, first and second detecting devices 25 and 26 are provided in order to measuring the light intensities condensed by the microlenses 21, 22. The first and second detecting devices 25 and 26 are coupled to a phase meter 40 for detecting the phases of the light beat signals outputted therefrom, which is in turn coupled to drive circuits 41 and 42 for driving the photomask stage 19 and the wafer stage 20. One feature of the fifth embodiment in optical arrangement is to use a light intensity attenuation device (for example, neutral density filter) 50 provided in the telecentric lens 14 for adjusting the light intensity.

Figure 17:
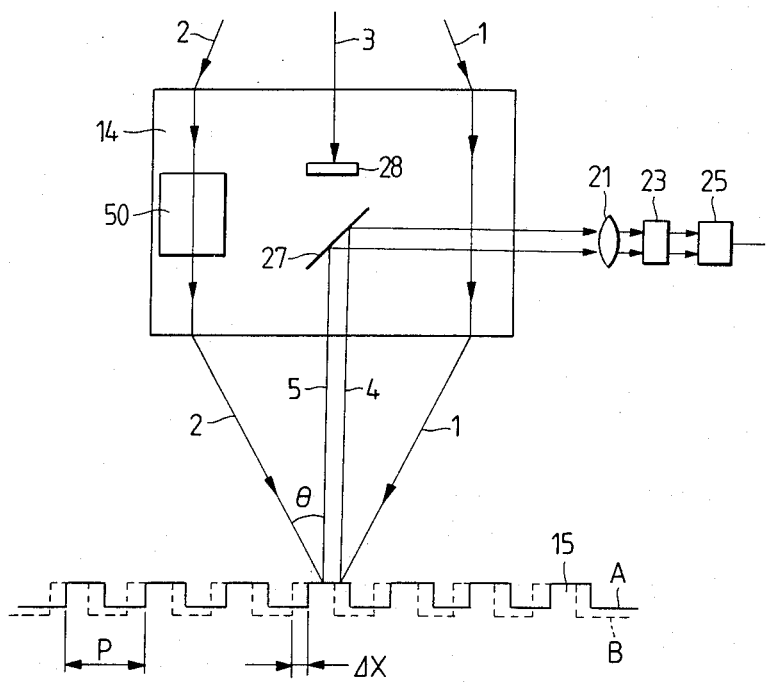
FIG. 17 is an illustration for describing the principal of the positioning of the fifth embodiment.

A description in terms of the positioning technique between the photomask 16 and the wafer 18 will be made hereinbelow with reference to FIG. 17 in which a solid line A shows the state that the second diffraction grating 15 on the photomask 16 is accurately positioned with respect to the reference grating 12 and a dotted line B shows the state that it is shifted by ΔX with respect thereto.

From the reference diffraction grating 12 +1 order diffracted light 1 and −1 order diffracted light 2 pass through the telecentric lens 14 and reach the second diffration grating 15 whereby +1 order diffracted light 4 and −1 order diffrated light 5 which are respectively expressed as (+1, +1), (−1, −1) are generated therefrom. In the telecentric lens 14 and for the −1 order diffracted light is provided the light-intensity attenuation device 50 which has characteristics of (1) allowing amplification or attenuation of the transmitted light intensity, (2) having different amplification factors and different attenuation factors with respect to the polarizing surface, and (3) being no variation of the polarizing direction of the incident and output light.

Thus, the complex amplitudes of the diffracted light (+1, +1), (−1, −1) with the frequency f1 under the condition that the second diffraction grating 15 is in the state indicated by the dotted light B are given in accordance with the following equations (29) and (30):

$$Ef1(+1, +1) = A_1 \exp\{i(\omega_1 t + \delta)\} \quad (29)$$

$$Ef1(-1, -1) = A_2 \exp\{i(\omega_1 t - \delta)\} \quad (30)$$

where $\omega_1 = 2\pi f1$, $\delta = 2\pi \cdot \Delta X/P$ and $A'_1$ and $A_2$ represents amplitudes and, if there is no the light-intensity attenuation device 50, $A_1 = A_2$, and in the case of the provision of the light-intensity attenuation device 50, A is not equal to A2. The complex amplitudes E(+1, +1), E(−1, −1) result in the following equation (31) due to interference with each other.

$$Ef1 = C_1 \exp\{i(\omega_1 t + \Delta 1)\} \quad (31)$$

When $\alpha = A_2/A_1$, $$C_1 = A_1\{2\alpha \cos(2\delta)\}^{\frac{1}{2}} \quad (32)$$

$$\Delta 1 = \tan^{-1}\left\{\frac{\alpha - 1}{\alpha + 1} \tan\delta\right\} \quad (33)$$

Similarly, the complex amplitudes of the diffracted light with the frequency f2 are given in accordance with the following equations:

$$Ef1(+1, +1) = A_1' \exp\{i(\omega_2 t + \delta) \quad (34)$$

$$Ef1(-1, -1) = A_2' \exp\{i(\omega_2 t - \delta)\} \quad (35)$$

where $\omega_2 = 2\pi f2$, and $A_1$ and $A_2$ represents amplitudes which are not equal to each other, and when $\beta = A_2'/A_1'$, $\alpha$ is not equal to $\beta$.

With the interference with each other the following result can be obtained:

$$Ef2 = C_2 \exp\{i(\omega_2 t + \Delta 2)\} \quad (36)$$

$$C_2 = A_1'\{2\alpha \cos(2\delta)\} \quad (37)$$

$$\Delta 2 = \tan^{-1}\left\{\frac{\beta - 1}{\beta + 1} \tan\delta\right\} \quad (38)$$

The diffracted light of the frequency f1 and the diffracted light of the frequency f2 are combined with each other by means of the first phase plate 23 after passed through the microlens 21 and the light intensity Is1 to be detected by the first detecting device 25 is given in accordance with the following equation (39). That is, $$Is1 = |Ef1 + Ef2|^2 = \quad (39)$$
$$C_1^2 + C_2^2 + 2C_1C_2 \cos\{(\omega_1 - \omega_2)t + (\Delta 1 - \Delta 2)\}$$

$$\Delta s1 = \Delta 1 - \Delta 2 = \tan^{-1}\left\{\tan^{-1}\left(\frac{(\alpha - 1)}{(\alpha + 1)} \tan\delta\right) - \tan^{-1}\left(\frac{(\beta - 1)}{(\beta + 1)} \tan\delta\right)\right\} \quad (40)$$

That is, the light beat signal Is1 including the phase shift Δs1 corresponding to the position difference ΔX can be detected thereby. Here, in the case of no provision of the light-intensity attenuation device 50, $\alpha = \beta = 1$ and therefore in the equation (40) $\Delta s1 = 0$ causing impossibility of the detection of the phase shift. Similarly, the diffracted light from the third diffraction grating 17 is detected by the second detecting device 26 after passed through the microlens 22 and the second phase plate 24 and the light intensity Is2 is given as follows:

$$Is1 = C_1^2 + C_2^2 + 2C_1C_2 \cos\{(\omega_1 - \omega_2)t + (\Delta 1' - \Delta 2')\} \quad (41)$$

$$\Delta s2 = \Delta 1' - \Delta 2' = \tan^{-1}\left\{\tan^{-1}\left(\frac{(\alpha - 1)}{(\alpha + 1)} \tan\delta\right) - \tan^{-1}\left(\frac{(\beta - 1)}{(\beta + 1)} \tan\delta\right)\right\} \quad (42)$$

So, it is possible to detect the light beat signal including the phase shift Δs2 for the position difference ΔX.

The photomask stage 19 or the wafer stage 20 is slightly adjusted in position so that Δs1 and Δs2 assume zero, resulting in effecting the relative positioning between the photomask 16 and wafer 18. The expression of an equation is as follows.

$$\Delta s1 - \Delta s2 = \tan^{-1}\left\{\tan^{-1}\left(\frac{(\alpha - 1)}{(\alpha + 1)} \tan\delta\right) - \tan^{-1}\left(\frac{(\beta - 1)}{(\beta + 1)} \tan\delta\right)\right\} - \tan^{-1}\left\{\tan^{-1}\left(\frac{(\alpha - 1)}{(\alpha + 1)} \tan\delta'\right) - \tan^{-1}\left(\frac{(\beta - 1)}{(\beta + 1)} \tan\delta'\right)\right\} \quad (43)$$

When $\delta = \delta'$, $\Delta s1 - \Delta s2 = 0°$, resulting in coincience in position between the photomask 16 and the wafer 18.

Although in this embodiment the light-intensity attenuation device 50 is provided for the −1 order diffracted light 2 on the spectrum surface 29, the provision thereof is not limited to the position and further it is also appropriate to provide the light-intensity attenuation device 50 for the +1 order diffracted light 3. Furthermore, it is also appropriate to provide two light-intensity attenuation devices 50 with different attenuation factors for the −1 order diffracted light 4 and +1 order diffracted light 4.

Figure 18:
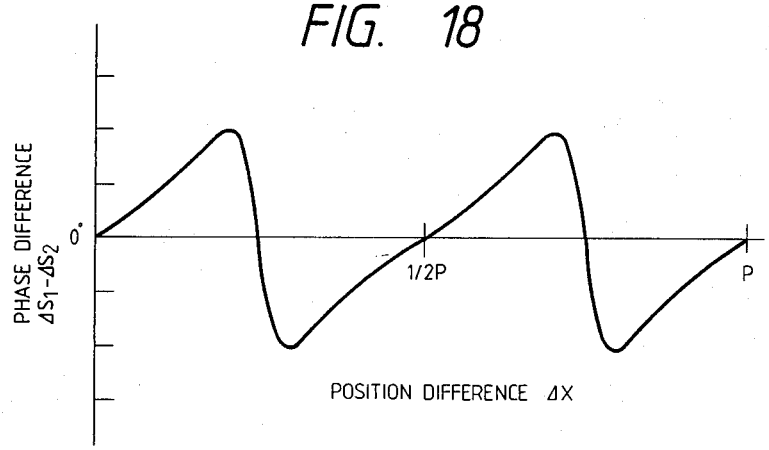
FIG. 18 shows the phase difference between the light beat signals with respect to the position difference between the photomask and the wafer.

FIG. 18 is an graphic diagram showing a result of a simulation made using a computer. When $\alpha = 0.4$ and $\beta = 0.6$, with the phase discrepancy $\Delta s1 - \Delta s2$ relating to the position difference ΔX between the photomask 16 and the wafer 18 the phase difference occurs at intervals of ½ of the grating pitch.

In this embodiment, because of the provision of the light-intensity attenuation device 50, even if the case of mixing of the frequencies f1 and f2, it is possible to use the diffracted light with low order such as +1 order diffracted light and −1 order diffracted light, resulting in improving the detection sensitivity.

It should be understood that the foregoing relates to only preferred embodiments of the present invention, and that it is intended to cover all changes and modifications of the embodiments of the invention herein used for the purposes of the disclosure, which do not constitute departures from the spirit and scope of this invention.

What is claimed is:

1. A position control system for controlling the relative relation in position between first and second position-controlled objects which are disposed in parallel to each other so as to form a predetermined gap therebetween and adapted to be movable relatively with respect to each other, comprising:

coherent light source means for generating two-wavelength light whose frequencies are slightly different from each other and whose polarizing directions are different from each other;

first diffraction grating means disposed in an optical path of the two-wavelength light generated from said coherent light source;

optical system means disposed in an optical path of the diffracted light from said first diffraction grating means for selectively transmitting the diffracted light therefrom;

second and third diffraction grating means disposed in an optical path of the light passed through said optical system means, said second diffraction grating means being placed on said first position-controlled object and said third diffraction grating means being placed on said second position-controlled object;

detecting means disposed in an optical path of the diffracted light from said second and third diffraction grating means for generating light beat signals corresponding to the diffracted light therefrom;

phase comparison means for making a comparison between said light beat signals from said detecting means to generate a position-difference signal corresponding to the result of the comparison; and position control means coupled to said phase comparison means for controlling the relative position between said first and second position-controlled objects on the basis of the position-difference signal generated from said phase comparison means.

2. A position control system as claimed in claim 1, further comprising at least one ½ wave plate disposed in the optical path of the diffracted light from said first diffraction grating means.

3. A position control system as claimed in claim 2, wherein said optical system means has therein a ½ wave plate at the vicinity of said spectrum surface which is used for at least either of the +1 order or −1 order diffracted light.

4. A position control system as claimed in claim 1, wherein said optical system means has a numerical aperture for allowing transmission of 0 order, +1 order and −1 order diffracted light from said first diffraction grating means, has therein a spectrum surface at positions of luminescent spots of the 0 order, +1 order and −1 order diffracted light therefrom and further a spece filter for cutting off one of the 0 order, +1 order and −1 order diffracted light therefrom, and is formed so that one surface facing said second and third diffraction grating means is telecentric.

5. A position control system as claimed in claim 1, wherein said detecting means generates said light beat signals on the basis of combinations of +1 order and −1 order diffracted light from said second and third diffraction grating means.

6. A position control system for controlling the relative relation in position between first and second position-controlled objects which are disposed in parallel to each other so as to form a predetermined gap therebetween and adapted to be movable relatively with respect to each other, comprising:

coherent light source means for similtaneously generating two light beams whose frequencies are slightly different from each other and whose polarizing directions are different from each other;

first diffraction grating means disposed in an optical path of the two-wavelength light generated from said coherent light source;

optical system means disposed in an optical path of the diffracted light from said first diffraction grating means for selectively transmitting the diffracted light therefrom;

second and third diffraction grating means disposed in an optical path of the light passed through said optical system means, said second diffraction grating means being placed on said first position-controlled object and said third diffraction grating means being placed on said second position-controlled object;

light combination means for respectively picking up groups of two wavelength diffracted light from said second and third diffraction grating means each group of which are coincident in direction with each other and different in frequency from each other and for respectively combining each group of the two wavelength diffracted light;

detecting means for detecting light beat signals correspondding to the respective combined diffracted light;

phase comparison means for making a comparison between said light beat signals from said detecting means to generate a position-difference signal corresponding to the result of the comparison, and position control means coupled to said phase comparison means for controlling the relative position between said first and second position-controlled objects on the basis of the position-difference signal generated from said phase comparison means.

7. A position control system as claimed in claim 6, wherein said light combination means comprises first and second light combiners for selectively taking out two groups of two-wavelength diffracted light from said second diffraction grating each of which are coincident in direction with each other and slightly different in frequency from each other and for optically combining each of the groups of the taken-out diffracted light and third and forth light combiners for selectively taking out two groups of two-wavelength diffracted light from said third diffraction grating means each of two groups of which are coincident in direction with each other and slightly different in frequency from each other and for optically combining respectively the selectively taken-out two groups of the two-wavelength diffracted light, and said detecting means comprises first and second detectors for detecting first and second light beat signals corresponding to the respective combined diffracted light by said first and second and third and fourth detectors for respectively detecting third and fourth light beat signals corresponding to the respective combined diffracted light due to said third and fourth light combiners, and said phase comparison means performs the phase comparison among said first to fourth light beat signals from said first to fourth detectors of said detecting means and said position control means controls the relative position between said first and second position-controlled objects on the basis of the position-difference signals therefrom so that the phase difference between said first and third light beat signals becomes zero and so that the phase difference between the second and fourth light beat signals become zero.

8. A position control system as claimed in claim 6, wherein said light combination means comprises first and second light combiners for selectively taking out two groups of two-wavelength diffracted light from said second diffraction grating means, the two diffracted light of each of two groups being coincident in direction with each other and slightly different in frequency from each other and for optically combining respectively the selectively taken-out two groups of the two-wavelength diffracted light and a third light combiner for taking out a group of two-wavelength diffracted light from said third diffraction grating means which are coincident in direction with each other and slightly different in frequency from each other and for optically combining the taken-out group of the two-wavelength diffracted light, and said detecting means comprises first and second detectors for respectively detecting first and second light beat signals corresponding to the combined diffracted light due to said first and second light combiners and a third detectors for detecting a third light beat signal corresponding to the combined diffracted light due to said third light combiner, and said phase comparison mean performs the phase comparison among said first to third light beat signals from said first to third detectors of said detecting means and said position control means controls the relative position between said first and second position-controlled objects on the basis of the position-difference signals therefrom so that the phase difference between said first and third light beat signals becomes zero and so that the phase difference between the first and second light beat signals becomes zero.

9. A position control system as claimed in claim 6, wherein said light combination means comprises a first light combiner for taking out a group of two-wavelength diffracted light from said second diffraction grating which are coincident in direction with each other and slightly different in frequency from each other and for optically combining the taken-out diffracted light and second and third light combiners for selectively taking out two group of two-wavelength diffracted light from said third diffraction grating means, the two diffracted light of each of two groups being coincident in direction with each other and slightly different in frequency from each other and for optically combining respectively the selectively taken-out two groups of the two-wavelength diffracted light, and said detecting means comprises a first detector for detecting a first light beat signal corresponding to the combined diffracted light by said first detector and second and third detectors for respectively detecting second and third light beat signals corresponding to the combined diffracted light due to said second and third light combiners, and said phase comparison means performs the phase comparison among said first to third light beat signals from said first to third detectors of said detecting means and said position control means controls the relative position between said first and second position-controlled objects on the basis of the position-difference signals therefrom so that the phase difference between said first and second light beat signals becomes zero and so that the phase difference between the second and third light beat signals becomes zero.

10. A position control system as claimed in claim 6, wherein said light combination means comprises a first combiner means for respectively taking out the group of the two wavelength diffracted light from said second diffraction grating means which are coincident in direction with each other and slightly different in frequency from each other and for optically combining the group of the diffracted light with each other and a second combiner for taking out the group of two wavelength diffracted light from said third diffraction grating means the group of which are coincident in direction with each other and slightly different in frequency from each other and for optically combining the group of the diffracted light with each other, and said detecting means comprises a first detector for detecting a first light beat signal corresponding to the combined diffracted light made by said first combiner of the light combination means and a second detector and a second detector for detecting a second light beat signal corresponding to the combined diffracted light made by said second combiner thereof.

11. A position control system as claimed in claim 6, further comprising at least one light-intensity attenuation means which is provided in the optical path of the diffracted light from said first diffraction grating means.

12. A position control system as claimed in claim 7, wherein said optical system means is arranged so as to transmit only the +1 and −1 order diffracted light from said first diffraction grating and each of said first, second, third and fourth light beat signals is due to a combination of the 0 order and −2 order diffracted light.

13. A position control system as claimed in claim 8, wherein said optical system means is arranged so as to transmit only the +1 order and −1 diffracted light from said first diffraction grating and each of said first, second and third light beat signals is due to a combination of the 0 order and −2 order diffracted light from said second and third diffraction grating means.

14. A position control system as claimed in claim 8, wherein said optical system means selects, of the diffracted light from said first diffraction grating means, the 0 order diffracted light and either of the +1 order or −1 order diffracted light and each of said first, second and third light beat signals is due to a combination of either of the +1 order or −1 order diffracted light and either of the +2 order or −2 order diffracted light from said second and third diffraction grating means.

15. A position control system as claimed in claim 9, wherein said optical system means is arranged so as to transit only the +1 order and −1 order diffracted light from said first diffraction grating and each of said first, second and third light beat signals is due to a combination of the 0 order and −2 order diffracted light from said second and third diffraction grating means.

16. A position control system as claimed in claim 9, wherein said optical system means selects, of the diffracted light from said first diffraction grating means, the 0 order diffracted light and either of the +1 order or −1 order diffracted light and each of said first, second and third light beat signals is due to a combination of either of the −1 order or −1 order diffracted light and either of the +2 order or −2 order diffracted light from said second and third diffraction grating means.

17. A position control system as claimed in claim 9, wherein said optical system means selects, of the diffracted light from said first diffraction grating means, the 0 order diffracted light and either of the +1 order or −1 order diffracted light and each of said first, second, third and fourth light beat signals is due to a combination of either of the +1 order or −1 order diffracted light and either of the +2 or −2 order diffracted light from said second and third diffraction grating means.

18. A position control system as claimed in claim 10, wherein said optical system means has a numerical aperture for allowing transmission of 0 order, +1 order and −1 order diffracted light from said first diffraction grating means, has therein a spectrum surface at positions of luminescent spots of the 0 order, +1 order and −1 diffracted light therefrom and further a spece filter for cutting off one of to 0 order, +1 order and −1 order diffracted light therefrom, and is formed so that one surface facing said second and third diffraction grating means is telecentric.

19. A position control system as claimed in claim 10, wherein said position control means controls the relative position between said first and second position-controlled objects on the basis of the position-difference signal from said phase comparison means so the phase difference between said first and second light beat signals from said first and second detectors of said detecting means.

20. A position control system as claimed in claim 10, wherein said optical system means is arranged so as to transmit only the +1 order and −1 order diffracted light from said first diffraction grating and each of said first and second light beat signals is due to a combination of the 0 order and −2 order diffracted light from said second and third diffraction grating means.

21. A position control system as claimed in claim 10, wherein said optical system means selects, of the diffracted light from said first diffraction grating means, the 0 order diffracted light and either of the +1 order or −1 order diffracted light and each of said first and second light beat signals is due to a combination of either of the +1 order or −1 order diffracted light and either of the +2 order or −2 order diffracted light from said second and third diffraction grating means.

22. A position control system as claimed in claim 11, wherein each of said first and third light beat signals is due to a combination of the +1 order and −1 order diffracted light from said second and third diffraction gratings.

23. A position control system as claimed in claim 11, wherein said optical system means has a numerical aperture for allowing transmission of 0 order, +1 order and −1 order diffracted light from said first diffraction grating means, has therein a spectrum surface at positions of luminescent spots of the 0 order, +1 order and −1 order diffracted light therefrom and further a space filter for cutting off the 0 order diffracted light therefrom.

24. A position control system as claimed in claim 23, wherein said light-intensity attenuation means is provided at the vicinity of said spectrum surface of said optical system means in order for the at least one of the +1 order and −1 order diffracted light.

* * * * *